US012652852B2

(12) United States Patent
Tanaka et al.

(10) Patent No.: US 12,652,852 B2
(45) Date of Patent: Jun. 9, 2026

(54) SEMICONDUCTOR DEVICE AND SEMICONDUCTOR PACKAGE

(71) Applicants: KABUSHIKI KAISHA TOSHIBA, Tokyo (JP); TOSHIBA ELECTRONIC DEVICES & STORAGE CORPORATION, Tokyo (JP)

(72) Inventors: Katsuhisa Tanaka, Himeji Hyogo (JP); Hiroshi Kono, Himeji Hyogo (JP)

(73) Assignees: Kabushiki Kaisha Toshiba, Kawasaki (JP); Toshiba Electronic Devices & Storage Corporation, Kawasaki (JP)

( * ) Notice: Subject to any disclaimer, the term of this patent is extended or adjusted under 35 U.S.C. 154(b) by 560 days.

(21) Appl. No.: 17/863,799

(22) Filed: Jul. 13, 2022

(65) Prior Publication Data

US 2023/0290850 A1 Sep. 14, 2023

(30) Foreign Application Priority Data

Mar. 8, 2022 (JP) ................................ 2022-035311

(51) Int. Cl.
*H10D 64/27* (2025.01)
*H10D 30/66* (2025.01)
(Continued)

(52) U.S. Cl.
CPC ........... *H10D 64/517* (2025.01); *H10D 30/66* (2025.01); *H10D 62/393* (2025.01);
(Continued)

(58) Field of Classification Search
CPC ...... H10D 8/60; H10D 30/668; H10D 62/102; H10D 62/127; H10D 64/112; H10D 64/117; H10D 64/23; H10D 84/146
(Continued)

(56) References Cited

U.S. PATENT DOCUMENTS 9,741,797 B2 8/2017 Kagawa et al.
2010/0224932 A1* 9/2010 Takaya ................ H10D 30/668
257/E21.334
(Continued)

FOREIGN PATENT DOCUMENTS

JP 2007242852 A 9/2007
JP 6038391 B2 12/2016
(Continued)

OTHER PUBLICATIONS

Notice of Reasons for Refusal (Office Action) mailed Mar. 13, 2025 in corresponding Japanese Patent Application No. 2022-035311 with English machine translation, 10 pages.

*Primary Examiner* — Fazli Erdem
(74) *Attorney, Agent, or Firm* — Kim & Stewart LLP

(57) ABSTRACT

According to one embodiment, a semiconductor device includes first and second electrodes, first to sixth semiconductor regions, a gate electrode, and a conductive part. The first semiconductor region is located on the first electrode. The first semiconductor region includes first and second regions. The second semiconductor region is located on the first region. The gate electrode is located on the second semiconductor region with a gate insulating layer interposed. The third semiconductor region is located on the first region and is separated from the second semiconductor region. The conductive part is located on the third semiconductor region with an insulating layer interposed. The fourth semiconductor region is located on the second region. The fifth semiconductor region is located on a portion of the fourth semiconductor region. The sixth semiconductor region contacts the third semiconductor region. The second electrode is located on the fourth and fifth semiconductor regions.

17 Claims, 20 Drawing Sheets

(51) Int. Cl.

| | |
|---|---|
| *H10D 62/17* | (2025.01) |
| *H10W 20/40* | (2026.01) |
| *H10W 70/60* | (2026.01) |
| *H10W 70/65* | (2026.01) |

(52) U.S. Cl.
CPC .......... *H10D 64/514* (2025.01); *H10W 20/40* (2026.01); *H10W 70/611* (2026.01); *H10W 70/65* (2026.01)

(58) Field of Classification Search
USPC ........................................................ 257/295
See application file for complete search history.

(56) References Cited

U.S. PATENT DOCUMENTS

| | | | |
|---|---|---|---|
| 2017/0271323 A1 | 9/2017 | Sugawara et al. | |
| 2018/0358454 A1 | 12/2018 | Okumura | |
| 2020/0266294 A1* | 8/2020 | Okumura | H10D 62/157 |
| 2021/0043765 A1 | 2/2021 | Tanaka et al. | |
| 2021/0074849 A1* | 3/2021 | Kinoshita | H10D 30/662 |
| 2021/0288156 A1 | 9/2021 | Fukui et al. | |
| 2021/0296487 A1 | 9/2021 | Fujisawa et al. | |
| 2021/0384298 A1* | 12/2021 | Hoshi | H01L 29/7803 |

FOREIGN PATENT DOCUMENTS

| | | |
|---|---|---|
| JP | 2018207101 A | 12/2018 |
| JP | 2020-038995 A | 3/2020 |
| JP | 2020-096082 A | 6/2020 |
| JP | 6753951 B2 | 9/2020 |
| JP | 2021-082848 A | 5/2021 |
| JP | 2021150406 A | 9/2021 |
| WO | 2019/186785 A1 | 10/2019 |

* cited by examiner

SEMICONDUCTOR DEVICE AND SEMICONDUCTOR PACKAGE

CROSS-REFERENCE TO RELATED APPLICATIONS

This application is based upon and claims the benefit of priority from Japanese Patent Application No. 2022-035311, filed on Mar. 8, 2022; the entire contents of which are incorporated herein by reference.

FIELD

Embodiments described herein relate generally to a semiconductor device and a semiconductor package.

BACKGROUND

Semiconductor devices such as metal oxide semiconductor field effect transistors (MOSFETs) and the like are used in, for example, power conversion. Technology that can suppress the breakdown of such semiconductor devices is desirable.

DETAILED DESCRIPTION

Figure 1:
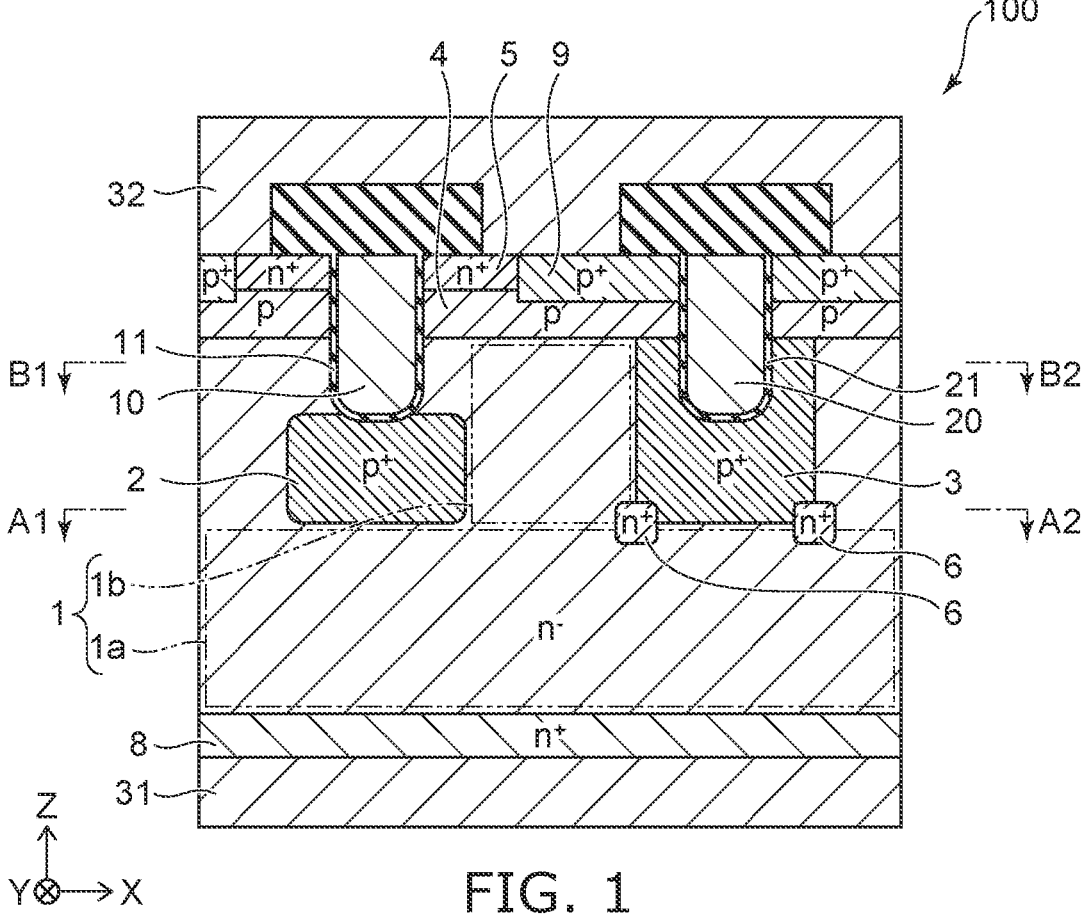
FIG. 1 is a cross-sectional view showing a portion of a semiconductor device according to a first embodiment.

According to one embodiment, a semiconductor device includes a first electrode, a first semiconductor region of a first conductivity type, a second semiconductor region of a second conductivity type, a gate electrode, a third semiconductor region of the second conductivity type, a conductive part, a fourth semiconductor region of the second conductivity type, a fifth semiconductor region of the first conductivity type, a sixth semiconductor region of the first conductivity type, and a second electrode. The first semiconductor region is located on the first electrode and electrically connected with the first electrode. The first semiconductor region includes a first region, and a second region located on the first region. The second semiconductor region is located on the first region. The gate electrode is located on the second semiconductor region with a gate insulating layer interposed. The third semiconductor region is located on the first region. The third semiconductor region is separated from the second semiconductor region with the second region interposed in a second direction. The second direction is perpendicular to a first direction. The first direction is from the first electrode toward the first semiconductor region. The conductive part is located on the third semiconductor region with an insulating layer interposed. The fourth semiconductor region is located on the second region, and contacts the third semiconductor region. The fifth semiconductor region is located on a portion of the fourth semiconductor region. The sixth semiconductor region contacts the third semiconductor region. A first-conductivity-type impurity concentration in the sixth semiconductor region is greater than a first-conductivity-type impurity concentration in the first semiconductor region. The second electrode is located on the fourth and fifth semiconductor regions and electrically connected with the fourth and fifth semiconductor regions.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously or illustrated in an antecedent drawing are marked with like reference numerals, and a detailed description is omitted as appropriate.

In the following description and drawings, the notations of $n^+$, $n^-$, $p^+$, and p indicate relative levels of the impurity concentrations. In other words, a notation marked with "+" indicates that the impurity concentration is relatively greater than that of a notation not marked with either "+" or "−"; and a notation marked with "−" indicates that the impurity concentration is relatively less than that of a notation without any mark. When both a p-type impurity and an n-type impurity are included in each region, these notations indicate relative levels of the net impurity concentrations after the impurities are compensated.

In embodiments described below, each embodiment may be implemented by inverting the p-type and the n-type of the semiconductor regions.

First Embodiment

FIG. 1 is a cross-sectional view showing a portion of a semiconductor device according to a first embodiment.

The semiconductor device according to the first embodiment is a MOSFET. As shown in FIG. 1, the semiconductor device 100 according to the first embodiment includes an $n^-$-type (first-conductivity-type) drift region 1 (a first semiconductor region), a $p^+$-type (second-conductivity-type) semiconductor region 2 (a second semiconductor region), a $p^+$-type semiconductor region 3 (a third semiconductor region), a p-type base region 4 (a fourth semiconductor region), an $n^+$-type source region 5 (a fifth semiconductor region), an $n^+$-type semiconductor region 6 (a sixth semiconductor region), an $n^+$-type drain region 8, a $p^+$-type contact region 9, a gate electrode 10, a conductive part 20, a drain electrode 31 (a first electrode), and a source electrode 32 (a second electrode).

An XYZ orthogonal coordinate system is used in the description of the embodiments. The direction from the drain electrode 31 toward the $n^-$-type drift region 1 is taken as a Z-direction (a first direction). One direction orthogonal to the Z-direction is taken as an X-direction (a second direction). A direction orthogonal to the X-direction and the Z-direction is taken as a Y-direction (a third direction). Herein, the direction from the drain electrode 31 toward the $n^-$-type drift region 1 is called "up", and the opposite direction is called "down". These directions are based on the relative positional relationship between the drain electrode 31 and the $n^-$-type drift region 1 and are independent of the direction of gravity.

The drain electrode 31 is located at the lower surface of the semiconductor device 100. The $n^+$-type drain region 8 is located on the drain electrode 31 and is electrically connected with the drain electrode 31. The $n^-$-type drift region 1 is located on the $n^+$-type drain region 8. The n-type impurity concentration of the $n^-$-type drift region 1 is less than the n-type impurity concentration of the $n^+$-type drain region 8. The $n^-$-type drift region 1 is electrically connected with the drain electrode 31 via the $n^+$-type drain region 8.

The $n^-$-type drift region 1 includes a first region 1a and a second region 1b. The second region 1b is partially located on the first region 1a. The $p^+$-type semiconductor region 2 and the $p^+$-type semiconductor region 3 are located on the first region 1a. The $p^+$-type semiconductor region 2 and the $p^+$-type semiconductor region 3 are separated from each other with the second region 1b interposed in the X-direction. In other words, the $p^+$-type semiconductor region 2, the second region 1b (a portion of the $n^-$-type drift region 1), and the $p^+$-type semiconductor region 3 are arranged in this order in the X-direction.

The gate electrode 10 is located on the $p^+$-type semiconductor region 2 with a gate insulating layer 11 interposed. The conductive part 20 is located on the $p^+$-type semiconductor region 3 with an insulating layer 21 interposed. A portion of the $p^+$-type semiconductor region 3 is located around the lower portion of the conductive part 20 along the X-Y plane.

The p-type base region 4 is located on the $n^-$-type drift region 1. The p-type base region 4 is separated from the $p^+$-type semiconductor region 2 and contacts the $p^+$-type semiconductor region 3. Therefore, the potential of the $p^+$-type semiconductor region 3 is substantially equal to the potential of the p-type base region 4. For example, the p-type impurity concentrations of the $p^+$-type semiconductor region 2 and the $p^+$-type semiconductor region 3 each are greater than the p-type impurity concentration of the p-type base region 4. The $n^+$-type source region 5 is located on a portion of the p-type base region 4. The $p^+$-type contact region 9 is located on another portion of the p-type base region 4. The p-type impurity concentration of the $p^+$-type contact region 9 is greater than the p-type impurity concentration of the p-type base region 4.

The gate electrode 10 faces the p-type base region 4 via the gate insulating layer 11 in the X-direction. In the illustrated example, the gate electrode 10 faces both the second region 1b and the $n^+$-type source region 5 via the gate insulating layer 11 in the X-direction. The conductive part 20 faces the $p^+$-type semiconductor region 3, the p-type base region 4, and the $p^+$-type contact region 9 via the insulating layer 21 in the X-direction.

The $n^+$-type semiconductor region 6 is separated from the $p^+$-type semiconductor region 2 and contacts the $p^+$-type semiconductor region 3. In the illustrated example, the $n^+$-type semiconductor region 6 is located directly under each of the two X-direction ends of the $p^+$-type semiconductor region 3.

The source electrode 32 is located on the $n^+$-type source region 5 and the $p^+$-type contact region 9 and electrically connected with the $n^+$-type source region 5 and the $p^+$-type contact region 9. The p-type base region 4 is electrically connected with the source electrode 32 via the $p^+$-type contact region 9. The gate electrode 10 and the conductive part 20 are electrically isolated from the source electrode 32 respectively by the gate insulating layer 11 and the insulating layer 21.

The conductive part 20 is electrically connected with the gate electrode 10. The potential of the conductive part 20 may be floating. A gate-drain capacitance Cgd can be reduced thereby, and the reverse transfer capacitance of the semiconductor device 100 can be reduced. Or, the conductive part 20 may be electrically connected with the source electrode 32.

A plurality of each of the second region 1b, the $p^+$-type semiconductor region 2, the $p^+$-type semiconductor region 3, the p-type base region 4, the $n^+$-type source region 5, the $p^+$-type contact region 9, the gate electrode 10, and the conductive part 20 is arranged in the X-direction and extends in the Y-direction. For example, the gate electrode 10 and the conductive part 20 are alternately arranged in the X-direction. When the conductive part 20 is electrically connected with the source electrode 32, the Y-direction end portion of the conductive part 20 is drawn upward and electrically connected with the source electrode 32.

Operations of the semiconductor device 100 will now be described.

A voltage that is not less than a threshold is applied to the gate electrode 10 in a state in which a positive voltage with respect to the source electrode 32 is applied to the drain electrode 31. Thereby, a channel (an inversion layer) is formed in the p-type base region 4; and the semiconductor device 100 is set to the on-state. Electrons flow from the source electrode 32 toward the drain electrode 31 via the channel. When the voltage that is applied to the gate electrode 10 drops below the threshold, the channel of the p-type base region 4 disappears, and the semiconductor device 100 switches to the off-state.

Examples of the materials of the components of the semiconductor device 100 will now be described.

The n⁻-type drift region 1, the p⁺-type semiconductor region 2, the p⁺-type semiconductor region 3, the p-type base region 4, the n⁺-type source region 5, the n⁺-type semiconductor region 6, the n⁺-type drain region 8, and the p⁺-type contact region 9 include a semiconductor material. Silicon carbide can be used as the semiconductor material. Silicon, gallium nitride, or gallium arsenide may be used as the semiconductor material. Arsenic, phosphorus, or antimony can be used as the n-type impurity. Boron can be used as the p-type impurity.

The gate insulating layer 11 and the insulating layer 21 include insulating materials. For example, the gate insulating layer 11 and the insulating layer 21 include silicon oxide, silicon nitride, or silicon oxynitride. The gate electrode 10 and the conductive part 20 include a conductive material such as polysilicon, etc. An n-type or p-type impurity may be added to the gate electrode 10 and the conductive part 20. The drain electrode 31 and the source electrode 32 include a metal such as titanium, tungsten, aluminum, etc.

FIGS. 2A to 4B are cross-sectional views showing manufacturing processes of the semiconductor device according to the first embodiment.

Figure 2A:
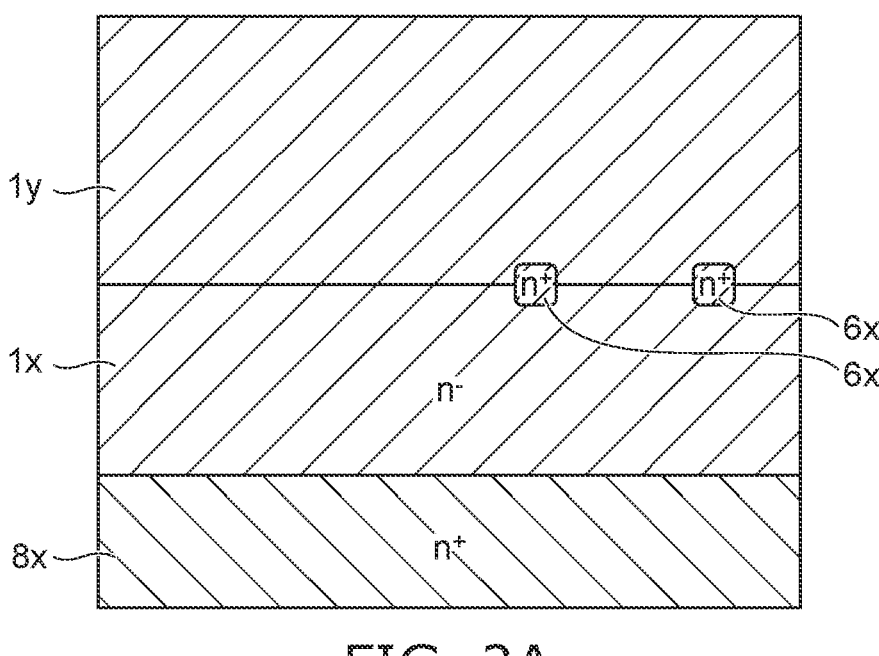
FIGS. 2A to 2B are cross-sectional views showing manufacturing processes of the semiconductor device according to the first embodiment.

An example of the method for manufacturing the semiconductor device 100 according to the first embodiment will now be described with reference to FIGS. 2A to 4B. First, a semiconductor substrate that includes an n⁺-type semiconductor layer 8x is prepared. An n⁻-type semiconductor layer 1x is formed by epitaxial growth on the n⁺-type semiconductor layer 8x. An n-type semiconductor layer 1y is formed by epitaxial growth on the n⁻-type semiconductor layer 1x. The n-type semiconductor layer 1y has a higher n-type impurity concentration than the n⁻-type semiconductor layer 1x. As shown in FIG. 2A, an n⁺-type semiconductor region 6x is formed by ion-implanting an n-type impurity into the n-type semiconductor layer 1y.

Figure 2B:
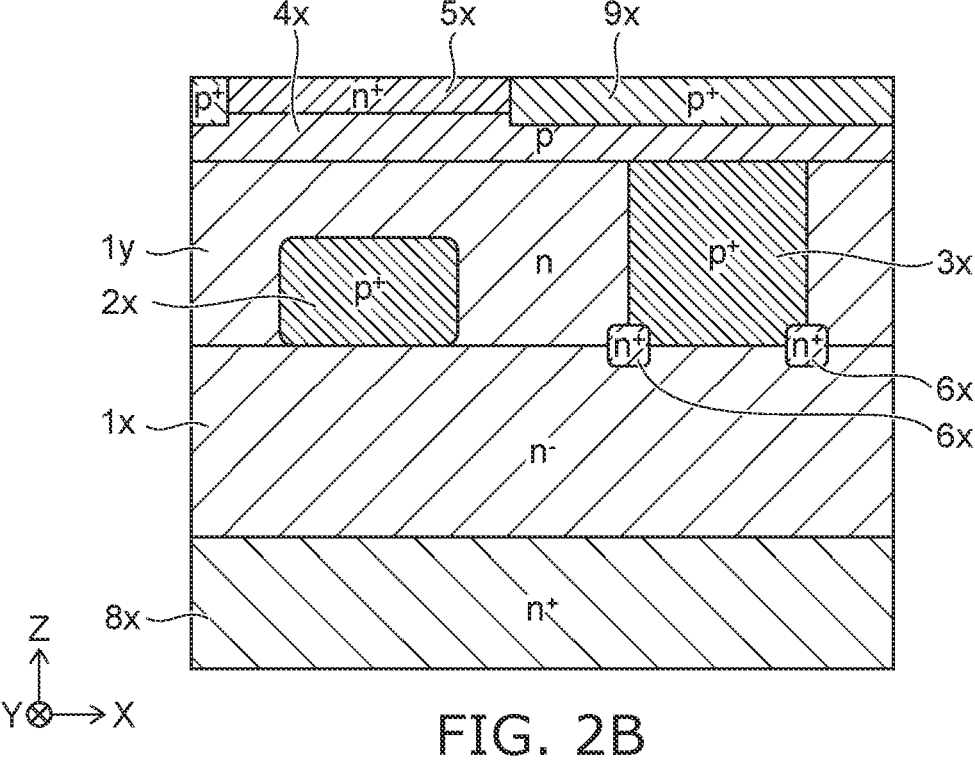

A p⁺-type semiconductor region 2x and a p⁺-type semiconductor region 3x are formed by ion-implanting a p-type impurity into the n-type semiconductor layer 1y. As shown in FIG. 2B, a p-type semiconductor region 4x, an n⁺-type semiconductor region 5x, and a p⁺-type semiconductor region 9x are formed by sequentially ion-implanting a p-type impurity and an n-type impurity into the upper surface of the n-type semiconductor layer 1y.

Figure 3A:
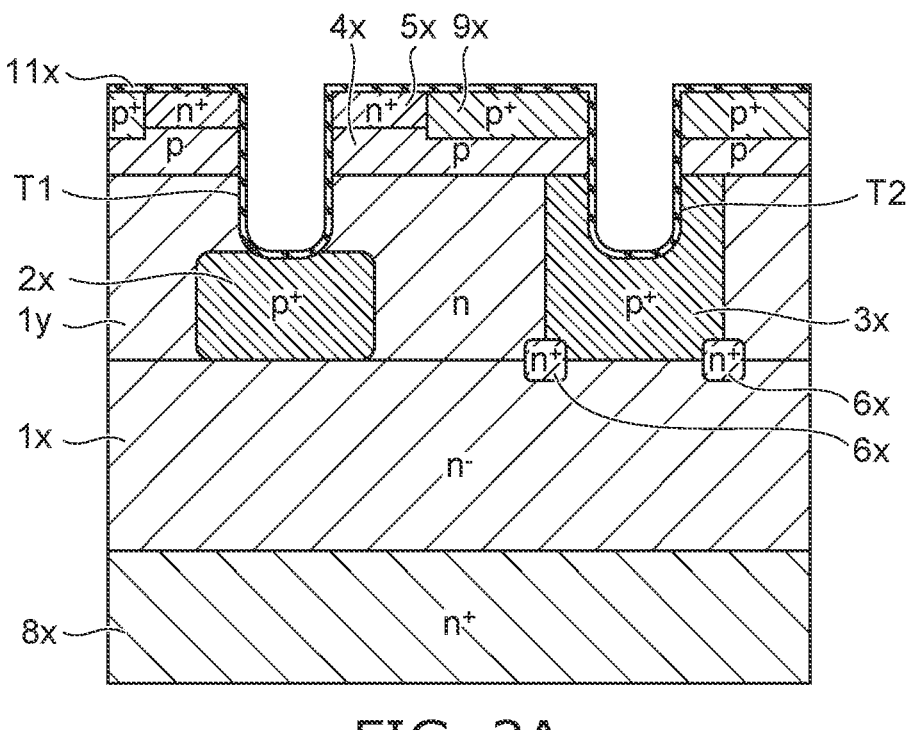
FIGS. 3A to 3B are cross-sectional views showing manufacturing processes of the semiconductor device according to the first embodiment.

A trench T1 that extends through the p-type semiconductor region 4x and the n⁺-type semiconductor region 5x and a trench T2 that extends through the p-type semiconductor region 4x and the p⁺-type semiconductor region 9x are formed by reactive ion etching (RIE). As shown in FIG. 3A, an insulating layer 11x is formed along the inner surfaces of the trenches T1 and T2 by thermal oxidation.

Figure 3B:
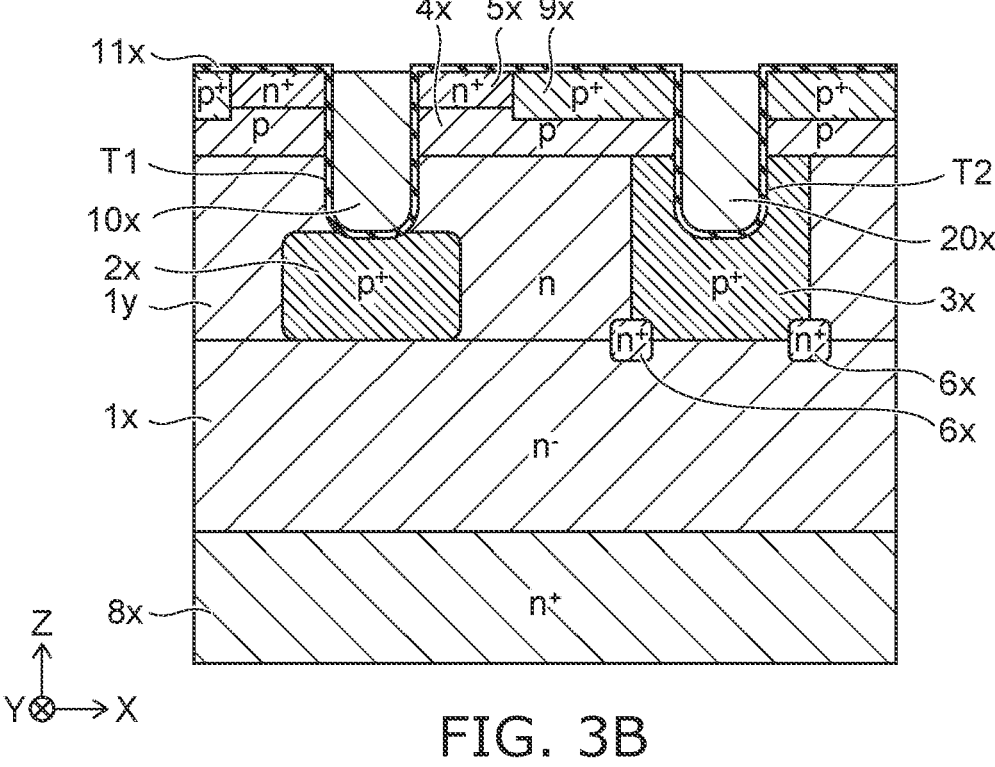

A conductive layer that fills the trenches T1 and T2 is formed by chemical vapor deposition (CVD) on the insulating layer 11x. The upper surface of the conductive layer is caused to recede by chemical dry etching (CDE). Thereby, as shown in FIG. 3B, a conductive layer 10x is formed inside the trench T1; and a conductive layer 20x is formed inside the trench T2.

Figure 4A:
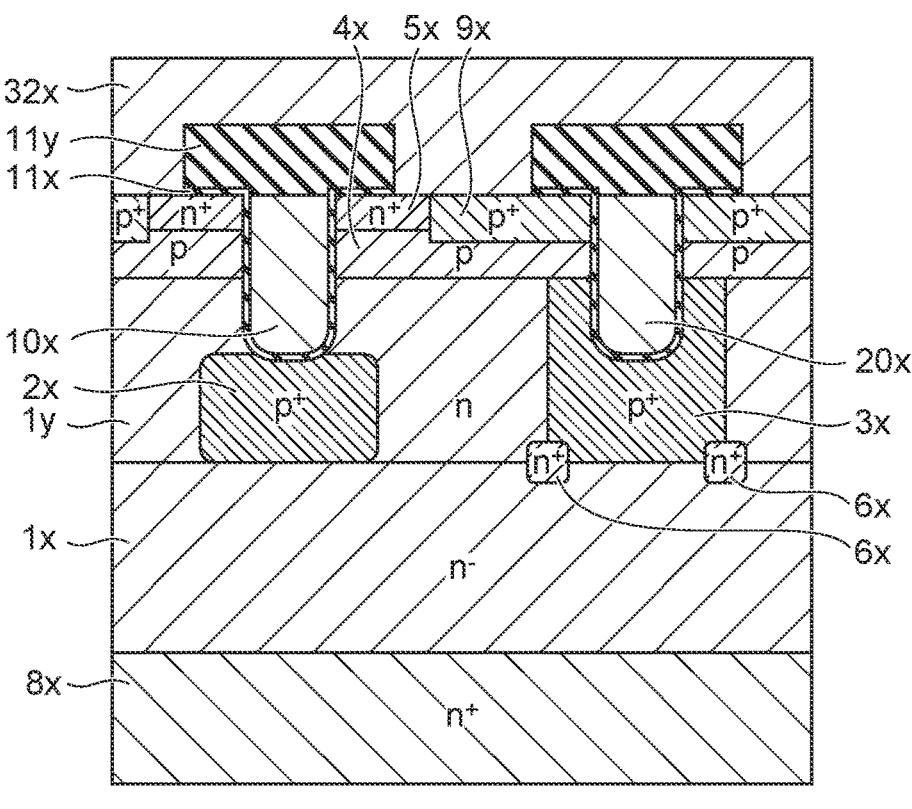
FIGS. 4A to 4B are cross-sectional views showing manufacturing processes of the semiconductor device according to the first embodiment.

An insulating layer 11y that covers the conductive layers 10x and 20x is formed. The n⁺-type semiconductor region 5x and the p⁺-type semiconductor region 9x are exposed by removing a portion of the insulating layer 11x and a portion of the insulating layer 11y by RIE. As shown in FIG. 4A, a metal layer 32x is formed on the insulating layers 11x and 11x.

Figure 4B:
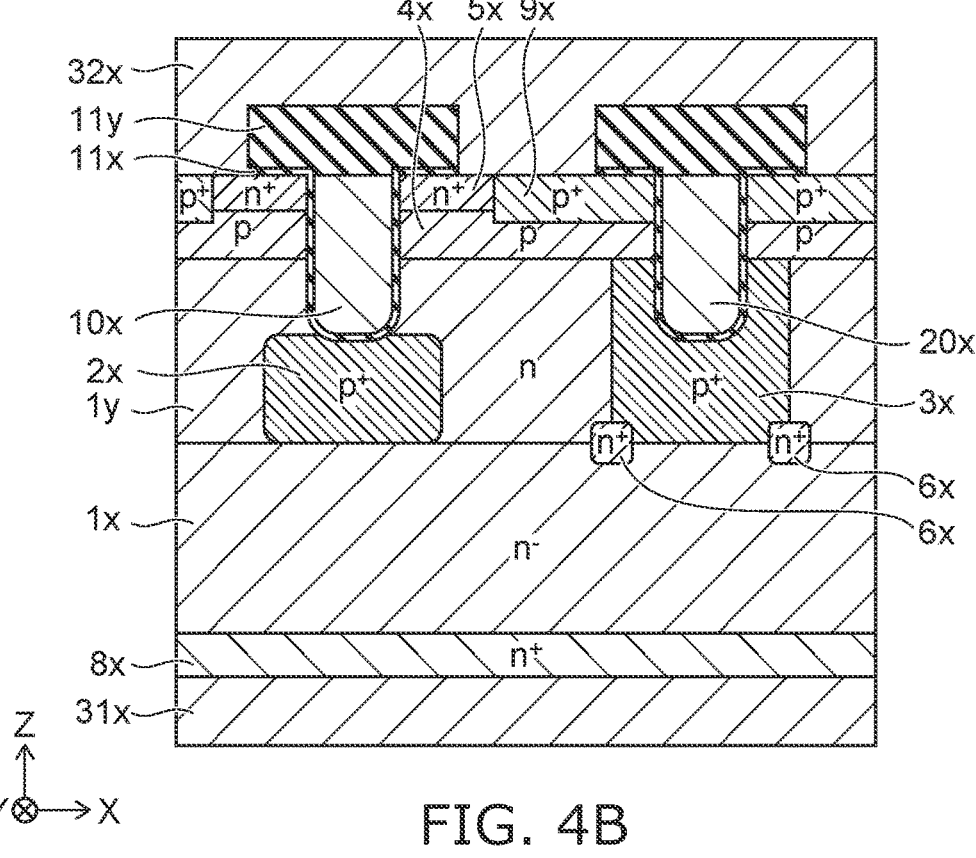

The lower surface of the n⁺-type semiconductor layer 8x is polished until the n⁺-type semiconductor layer 8x has a prescribed thickness. As shown in FIG. 4B, a metal layer 31x is formed under the n⁺-type semiconductor layer 8x. The semiconductor device 100 shown in FIG. 1 is manufactured by the processes described above.

The n⁻-type semiconductor layer 1x shown in FIG. 4B corresponds to the first region 1a of the n⁻type drift region 1 shown in FIG. 1. The n-type semiconductor layer 1y corresponds to the second region 1b. The p⁺-type semiconductor region 2x and the p⁺-type semiconductor region 3x correspond respectively to the p⁺-type semiconductor region 2 and the p⁺-type semiconductor region 3. The p-type semiconductor region 4x corresponds to the p-type base region 4. The n⁺-type semiconductor region 5x corresponds to the n⁺-type source region 5. The n⁺-type semiconductor region 6x corresponds to the n⁺-type semiconductor region 6. The n⁺-type semiconductor layer 8x corresponds to the n⁺-type drain region 8. The p⁺-type semiconductor region 9x corresponds to the p⁺-type contact region 9. The conductive layer 10x corresponds to the gate electrode 10. The conductive layer 20x corresponds to the conductive part 20. The metal layer 31x corresponds to the drain electrode 31. The metal layer 32x corresponds to the source electrode 32.

The semiconductor device 100 according to the first embodiment also can be manufactured by methods for manufacturing other than that of the illustrated example. For example, the n-type semiconductor layer 1y may be formed by performing epitaxial growth multiple times. A p-type impurity is ion-implanted into the regions corresponding to the p⁺-type semiconductor region 2x and the p⁺-type semiconductor region 3x as each layer is epitaxially grown. The lower portion of the p⁺-type semiconductor region 3x is formed by ion implantation similar to that of the p⁺-type semiconductor region 2x; and the upper portion of the p⁺-type semiconductor region 3x may be formed by ion implantation via the trench T2. The specific method of the ion implantation also can be selected as appropriate from a method of ion-implanting in a direction oblique to the normal direction of the semiconductor substrate surface, high-acceleration ion implantation, etc.

Advantages of the first embodiment will now be described.

Figure 5:
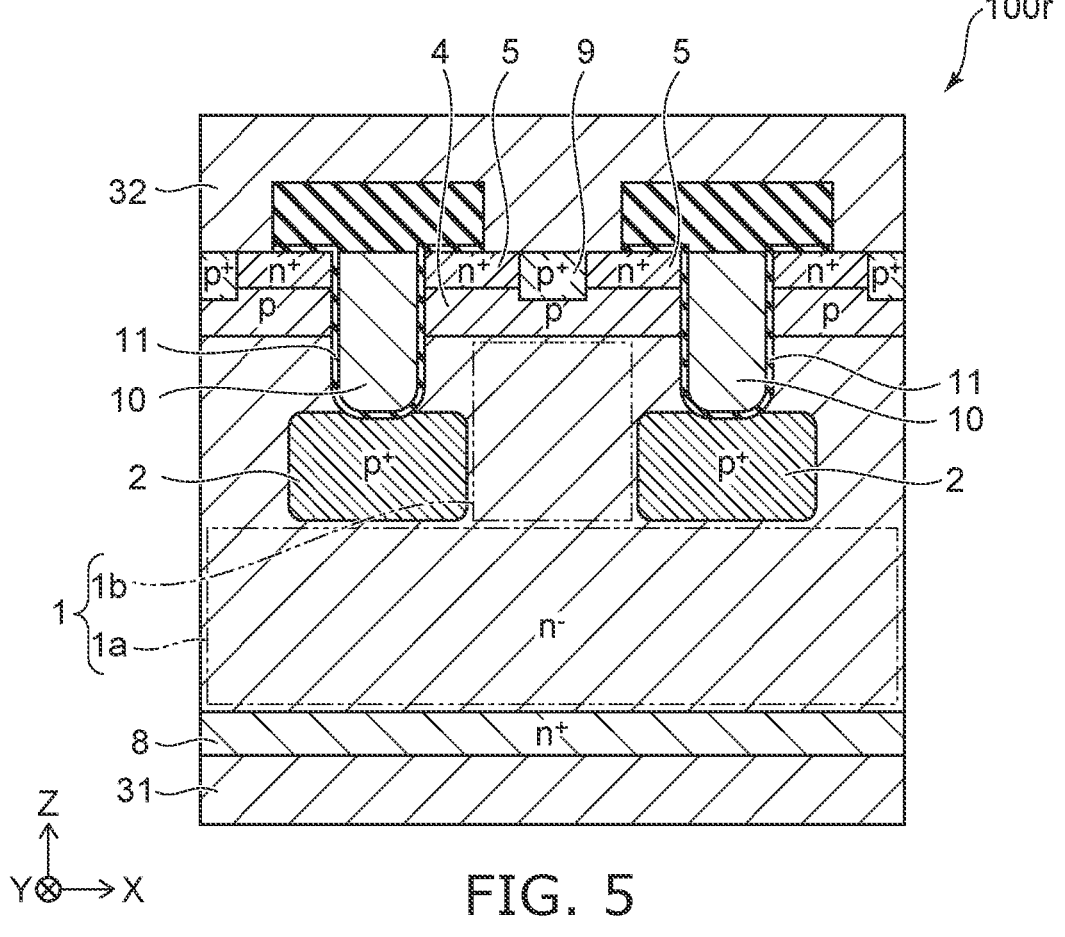
FIG. 5 is a cross-sectional view showing a portion of a semiconductor device according to a reference example.

FIG. 5 is a cross-sectional view showing a portion of a semiconductor device according to a reference example.

Compared to the semiconductor device 100, the semiconductor device 100r shown in FIG. 5 does not include the p⁺-type semiconductor region 3, the conductive part 20, the n⁺-type semiconductor region 6, etc. In the semiconductor device 100r, the p⁺-type semiconductor region 2 is located under the gate electrode 10. Therefore, avalanche breakdown easily occurs between the n⁻-type drift region 1 and the p⁺-type semiconductor region 2, and the occurrence of avalanche breakdown at the bottom portion of the gate electrode 10 can be suppressed. As a result, the dielectric breakdown of the gate insulating layer 11 does not occur easily.

In the semiconductor device 100r, avalanche breakdown may be concentrated between the n⁻-type drift region 1 and one of the p⁺-type semiconductor regions 2. A large amount of holes and electrons is generated thereby. The generated holes attack the gate insulating layer 11; and a short occurs between the gate electrode 10, the drain electrode 31, and the source electrode 32. Breakdown of the semiconductor device 100r is caused thereby.

The semiconductor device 100 includes the n⁺-type semiconductor region 6 that contacts the p⁺-type semiconductor region 3. The n-type impurity concentration of the n⁺-type semiconductor region 6 is greater than the n-type impurity concentration of the n⁻-type drift region 1. Therefore, at the breakdown voltage of the semiconductor device 100, the electric field strength at the p-n junction vicinity between the p⁺-type semiconductor region 3 and the n⁺-type semiconductor region 6 is greater than the electric field strength at the p-n junction vicinity between the n⁻-type drift region 1 and the p⁺-type semiconductor region 2. Avalanche breakdown can be caused to occur between the p⁺-type semiconductor region 3 and the n⁺-type semiconductor region 6; and the occurrence of avalanche breakdown between the n⁻-type drift region 1 and the p⁺-type semiconductor region 2 can be suppressed.

A large amount of holes and electrons is generated when avalanche breakdown occurs. The holes are discharged to the source electrode 32 via the p-type base region 4. The electrons are discharged to the drain electrode 31 via the n⁻-type drift region 1 and the n⁺-type drain region 8. In the semiconductor device 100, the p⁺-type semiconductor region 3 contacts the p-type base region 4. The electrical resistance to holes between the p⁺-type semiconductor region 3 and the p-type base region 4 is less than the electrical resistance to holes between the p⁺-type semiconductor region 2 and the p-type base region 4. Therefore, holes easily flow into the p-type base region 4 when avalanche breakdown occurs between the p⁺-type semiconductor region 3 and the n⁺-type semiconductor region 6. Breakdown of the gate insulating layer 11 due to avalanche breakdown is suppressed thereby. Breakdown of the semiconductor device 100 can be suppressed, and the reliability of the semiconductor device 100 can be increased.

It is favorable for the n-type impurity concentration of the second region 1b to be greater than the n-type impurity concentration of the first region 1a. The second region 1b is arranged with the gate electrode 10 in the X-direction and depletes more easily than the first region 1a. By the second region 1b having a higher n-type impurity concentration than the first region 1a, the on-resistance of the semiconductor device 100 can be reduced while suppressing the reduction of the breakdown voltage of the semiconductor device 100.

Avalanche breakdown between the p⁺-type semiconductor region 3 and the n⁺-type semiconductor region 6 occurs more easily as the n-type impurity concentration of the n⁺-type semiconductor region 6 increases. On the other hand, when the n-type impurity concentration of the n⁺-type semiconductor region 6 is too high, the n-type impurity may diffuse from the n⁺-type semiconductor region 6 into other semiconductor regions; and the breakdown voltage of the semiconductor device 100 may be reduced. It is therefore favorable for the n-type impurity concentration of the n⁺-type semiconductor region 6 to be greater than $1.0 \times 10^{17}$ atoms/cm³ and less than $1.0 \times 10^{18}$ atoms/cm³. To sufficiently relax the electric field strength below the conductive part 20 while suppressing the diffusion of the p-type impurity, it is favorable for the p-type impurity concentration of the p⁺-type semiconductor region 3 to be greater than $1.0 \times 10^{17}$ atoms/cm³ and less than $1.0 \times 10^{19}$ atoms/cm³.

Examples of favorable impurity concentrations of the other semiconductor regions is as follows. The n-type impurity concentration of the n⁻-type drift region 1 is greater than $1.0 \times 10^{15}$ atoms/cm³ and less than $5.0 \times 10^{16}$ atoms/cm³. The p-type impurity concentration of the p⁺-type semiconductor region 2 is greater than $1.0 \times 10^{18}$ atoms/cm³ and less than $1.0 \times 10^{19}$ atoms/cm³. The p-type impurity concentration of the p-type base region 4 is greater than $1.0 \times 10^{16}$ atoms/cm³ and less than $5.0 \times 10^{18}$ atoms/cm³. The n-type impurity concentration of the n⁺-type source region 5 is greater than $5.0 \times 10^{18}$ atoms/cm³ and less than $5.0 \times 10^{20}$ atoms/cm³. The n-type impurity concentration of the n⁺-type drain region 8 is greater than $1.0 \times 10^{18}$ atoms/cm³ and less than $1.0 \times 10^{20}$ atoms/cm³. The p-type impurity concentration of the p⁺-type contact region 9 is greater than $1.0 \times 10^{18}$ atoms/cm³ and less than $1.0 \times 10^{20}$ atoms/cm³.

FIG. 6A, FIG. 6B, FIG. 7A, and FIG. 7B are plan views showing portions of semiconductor devices according to the first embodiment.

Figure 6A:
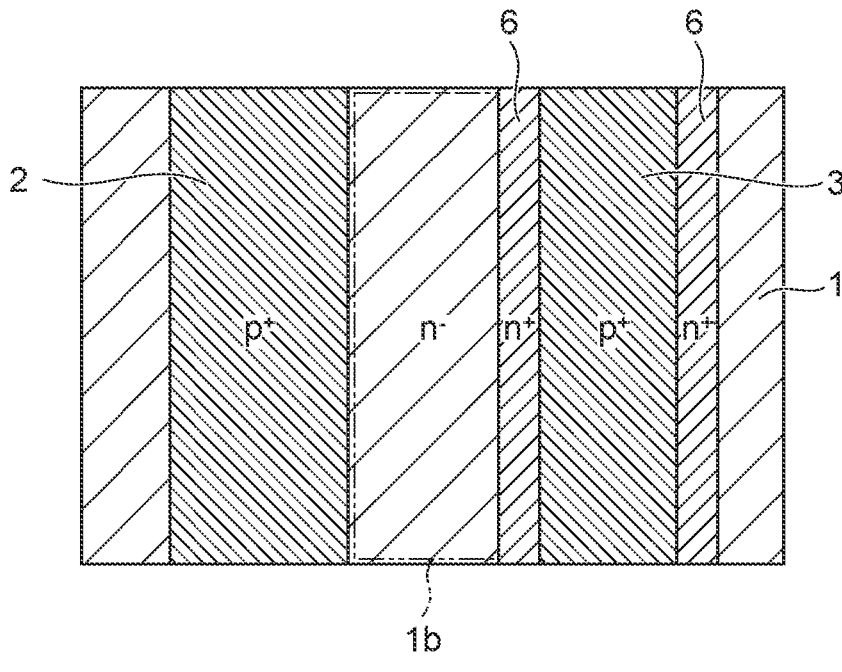
FIGS. 6A and 6B are plan views showing portions of semiconductor devices according to the first embodiment.
Figure 6B:
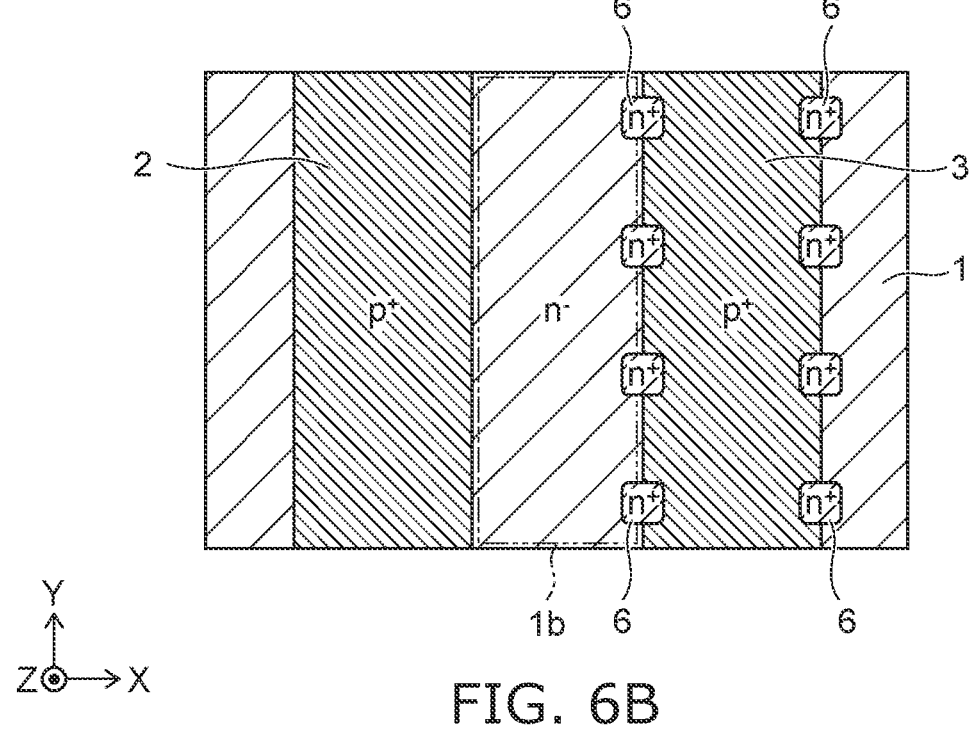

FIGS. 6A and 6B correspond to an A1-A2 cross section of FIG. 1. As shown in FIG. 6A, the n⁺-type semiconductor region 6 may extend in the Y-direction along the p⁺-type semiconductor region 3. As shown in FIG. 6B, the multiple n⁺-type semiconductor regions 6 may be separated from each other and arranged in the Y-direction.

According to the structure shown in FIG. 6A, avalanche breakdown can occur more uniformly in the Y-direction compared to the structure shown in FIG. 6B. As a result, the occurrence of avalanche breakdown between the n⁻-type drift region 1 and the p⁺-type semiconductor region 2 is further suppressed.

Figure 7A:
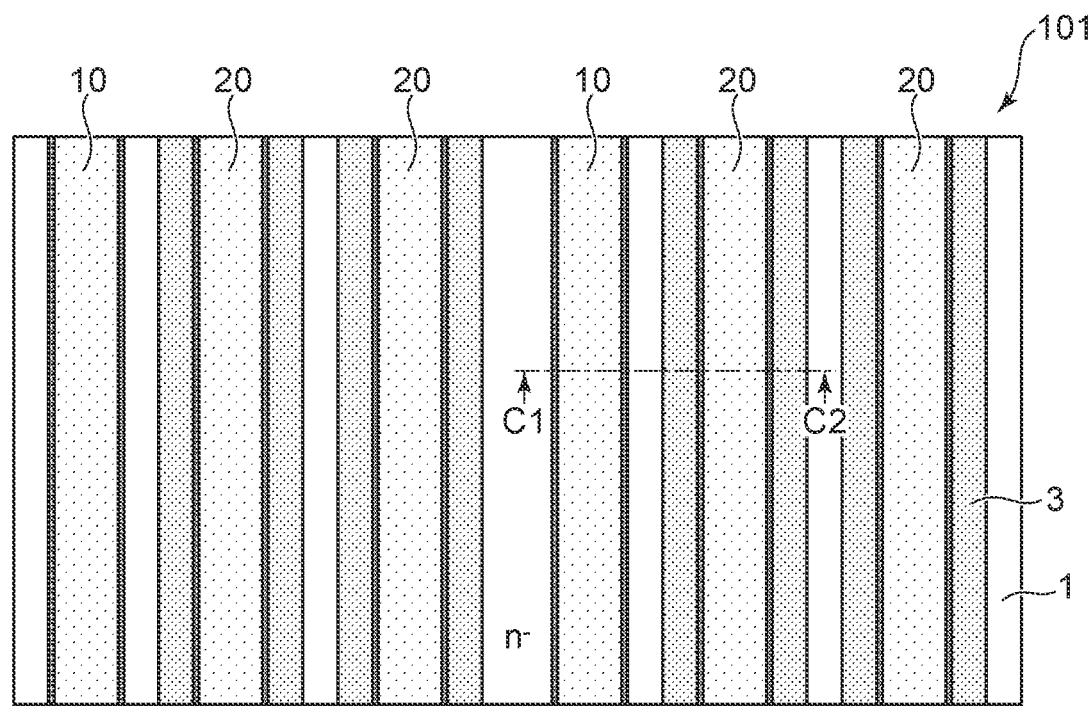
FIGS. 7A and 7B are plan views showing portions of semiconductor devices according to the first embodiment.
Figure 7B:
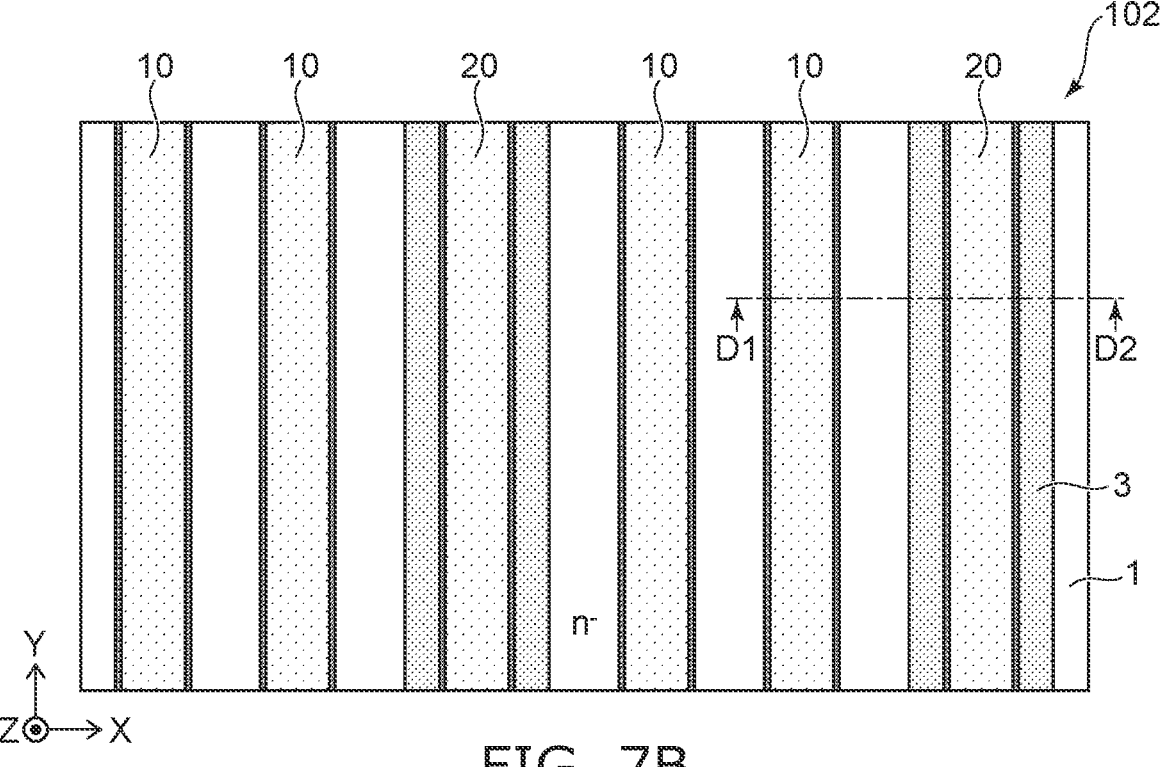

FIGS. 7A and 7B correspond to a B1-B2 cross section of FIG. 1. In the X-Y plane, the number of the gate electrodes 10 per unit area may be equal to or different from the number of the conductive parts 20 per unit area.

The semiconductor device 100 includes, for example, a first structure part 101 shown in FIG. 7A. In the first structure part 101, two or more conductive parts 20 and one gate electrode 10 are alternately arranged in the X-direction. The number of the conductive parts 20 per unit area is greater than the number of the gate electrodes 10 per unit area. By providing the first structure part 101, avalanche breakdown can occur easily between the p⁺-type semiconductor region 3 and the n⁺-type semiconductor region 6.

The semiconductor device 100 may include a second structure part 102 shown in FIG. 7B. In the second structure part 102, two or more gate electrodes 10 and one conductive part 20 are alternately arranged in the X-direction. The number of the gate electrodes 10 per unit area is greater than the number of the conductive parts 20 per unit area. By providing the second structure part 102, the channel density in the on-state can be increased, and the on-resistance of the semiconductor device 100 can be reduced.

The cross-sectional structure at line C1-C2 shown in FIG. 7A and the cross-sectional structure at line D1-D2 shown in FIG. 7B are similar to the structure of the cross section shown in FIG. 1. The semiconductor device 100 may include only one of the first structure part 101 or the second structure part 102, or may include both the first structure part 101 and the second structure part 102.

Figure 8:
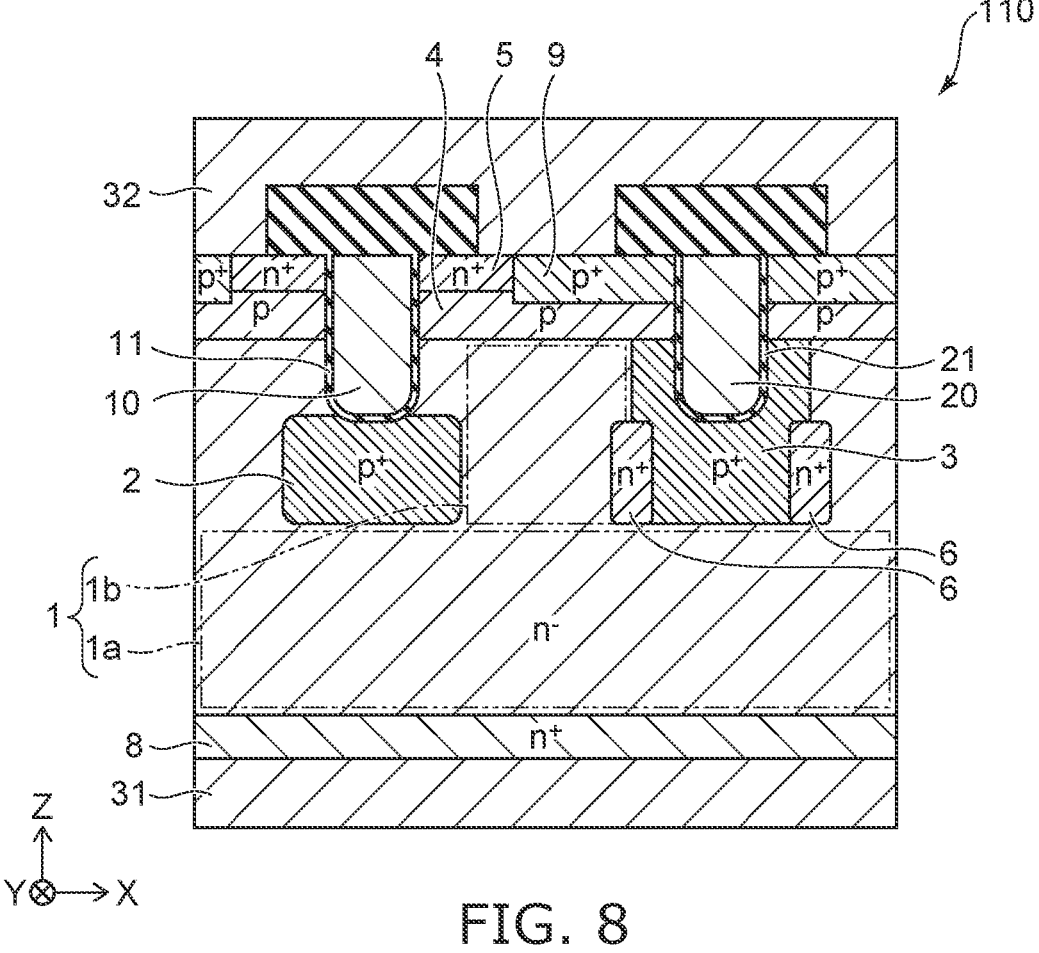
FIG. 8 is a schematic view showing a portion of a semiconductor device according to a first modification of the first embodiment.

FIG. 8 is a schematic view showing a portion of a semiconductor device according to a first modification of the first embodiment.

In the semiconductor device 110 according to the first modification as shown in FIG. 8, the Z-direction position of the lower end of the n$^+$-type semiconductor region 6 is the same as the Z-direction position of the lower end of the p$^+$-type semiconductor region 3. The n$^+$-type semiconductor region 6 is positioned at the two X-direction side portions of the p$^+$-type semiconductor region 3. The n$^+$-type semiconductor region 6 of the semiconductor device 110 is longer in the Z-direction than the n$^+$-type semiconductor region 6 of the semiconductor device 100.

Figure 9:
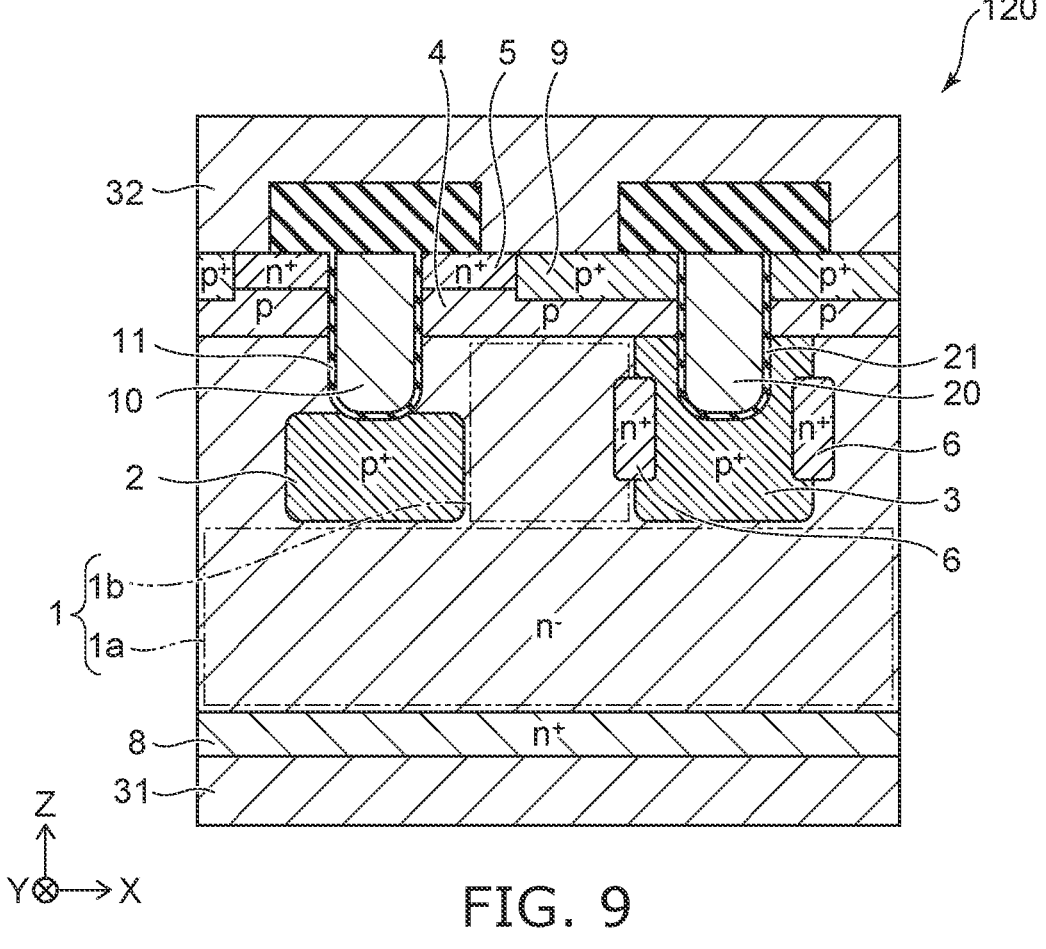
FIG. 9 is a schematic view showing a portion of a semiconductor device according to a second modification of the first embodiment.

FIG. 9 is a schematic view showing a portion of a semiconductor device according to a second modification of the first embodiment.

In the semiconductor device 120 according to the second modification as shown in FIG. 9, the lower end of the n$^+$-type semiconductor region 6 is positioned higher than the lower end of the p$^+$-type semiconductor region 3. The n$^+$-type semiconductor region 6 is positioned at the two X-direction side portions of the p$^+$-type semiconductor region 3. The lower portion of the conductive part 20 is positioned between the n$^+$-type semiconductor regions 6 in the X-direction.

Figure 10:
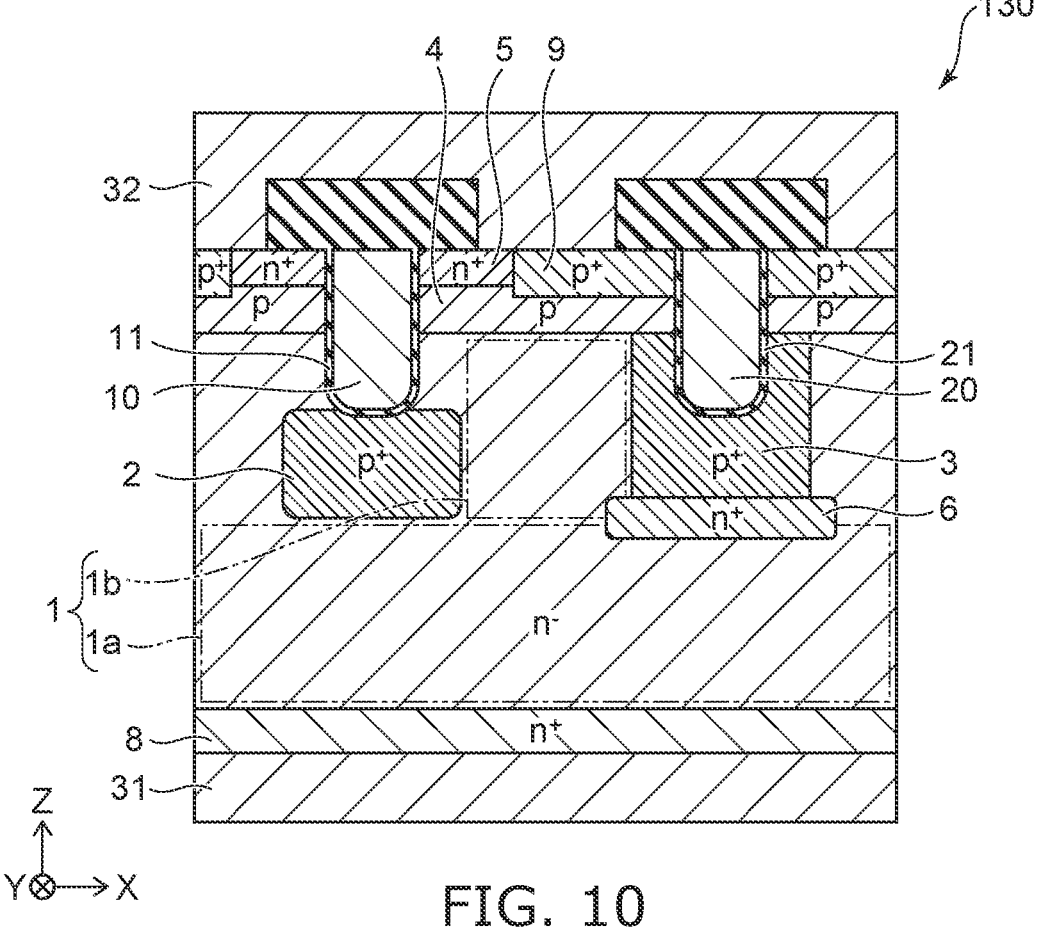
FIG. 10 is a schematic view showing a portion of a semiconductor device according to a third modification of the first embodiment.
Figure 11:
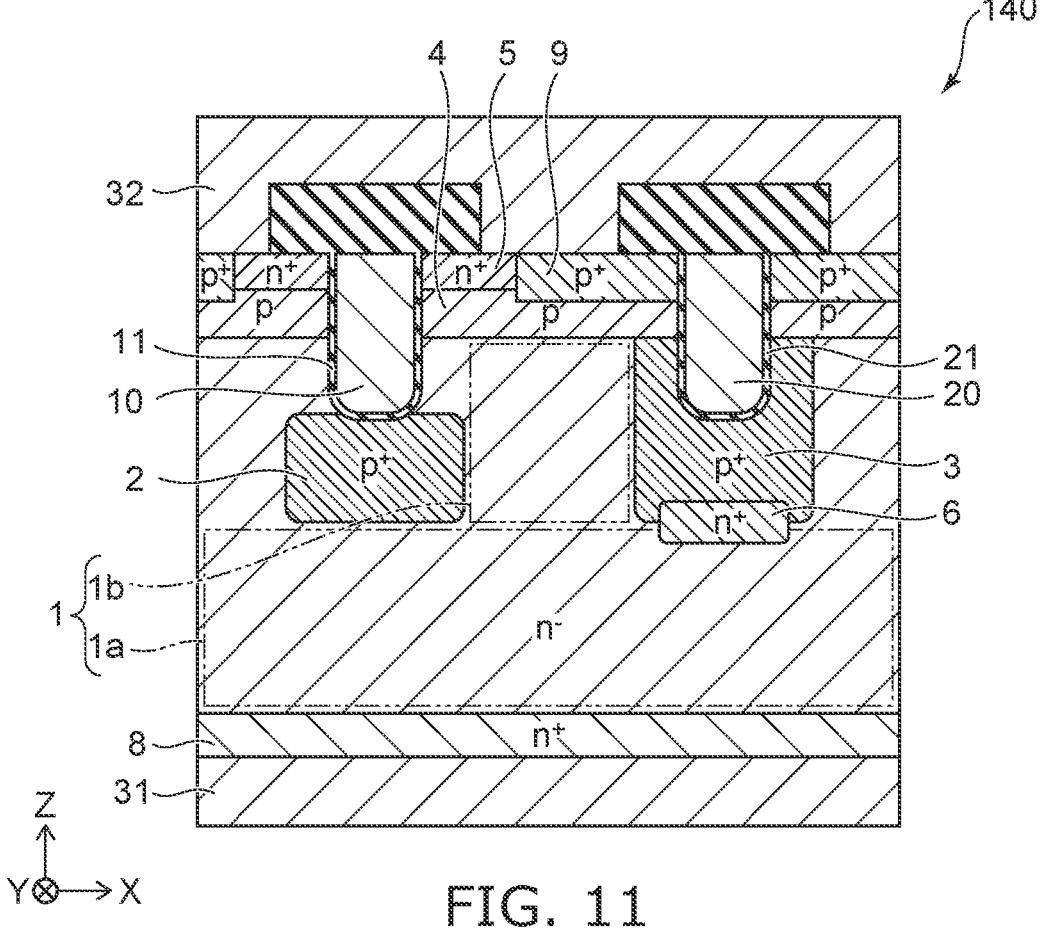
FIG. 11 is a schematic view showing a portion of a semiconductor device according to a fourth modification of the first embodiment.

FIG. 10 is a schematic view showing a portion of a semiconductor device according to a third modification of the first embodiment. FIG. 11 is a schematic view showing a portion of a semiconductor device according to a fourth modification of the first embodiment.

In the semiconductor devices 130 and 140 according to the third and fourth modifications as shown in FIGS. 10 and 11, the n$^+$-type semiconductor region 6 is located between the first region 1*a* and the p$^+$type semiconductor region 3 in the Z-direction. In the semiconductor device 130 shown in FIG. 10, the length in the X-direction of the n$^+$-type semiconductor region 6 is greater than the length in the X-direction of the p$^+$-type semiconductor region 3. In the semiconductor device 140 shown in FIG. 11, the length in the X-direction of the n$^+$-type semiconductor region 6 is less than the length in the X-direction of the p$^+$-type semiconductor region 3.

In each of the semiconductor devices shown in FIGS. 8 to 11, the n$^+$-type semiconductor region 6 that contacts the p$^+$-type semiconductor region 3 is included, and the p$^+$-type semiconductor region 3 contacts the p-type base region 4. Therefore, breakdown of the semiconductor device due to the avalanche breakdown can be suppressed.

More favorably, as shown in FIG. 8, FIG. 10, and FIG. 11, the n$^+$-type semiconductor region 6 contacts at least a portion of the lower end of the p$^+$-type semiconductor region 3. The electric field strength is higher at the lower end vicinity of the p$^+$-type semiconductor region 3 than the upper portion of the p$^+$-type semiconductor region 3. Because the n$^+$-type semiconductor region 6 contacts at least a portion of the lower end of the p$^+$-type semiconductor region 3, avalanche breakdown occurs more easily between the p$^+$-type semiconductor region 3 and the n$^+$-type semiconductor region 6. The occurrence of avalanche breakdown between the n$^-$type drift region 1 and the p$^+$-type semiconductor region 2 is further suppressed.

In particular, as shown in FIGS. 8 and 10, it is favorable for the n$^+$-type semiconductor region 6 to contact the lower end of the X-direction end portion of the p$^+$-type semiconductor region 3. The electric field strength is greatest at the lower end. Because the n$^+$-type semiconductor region 6 contacts the lower end of the X-direction end portion of the p$^+$-type semiconductor region 3, avalanche breakdown occurs more easily between the p$^+$-type semiconductor region 3 and the n$^+$-type semiconductor region 6. The occurrence of avalanche breakdown between the n$^-$-type drift region 1 and the p$^+$-type semiconductor region 2 is further suppressed.

Figure 12:
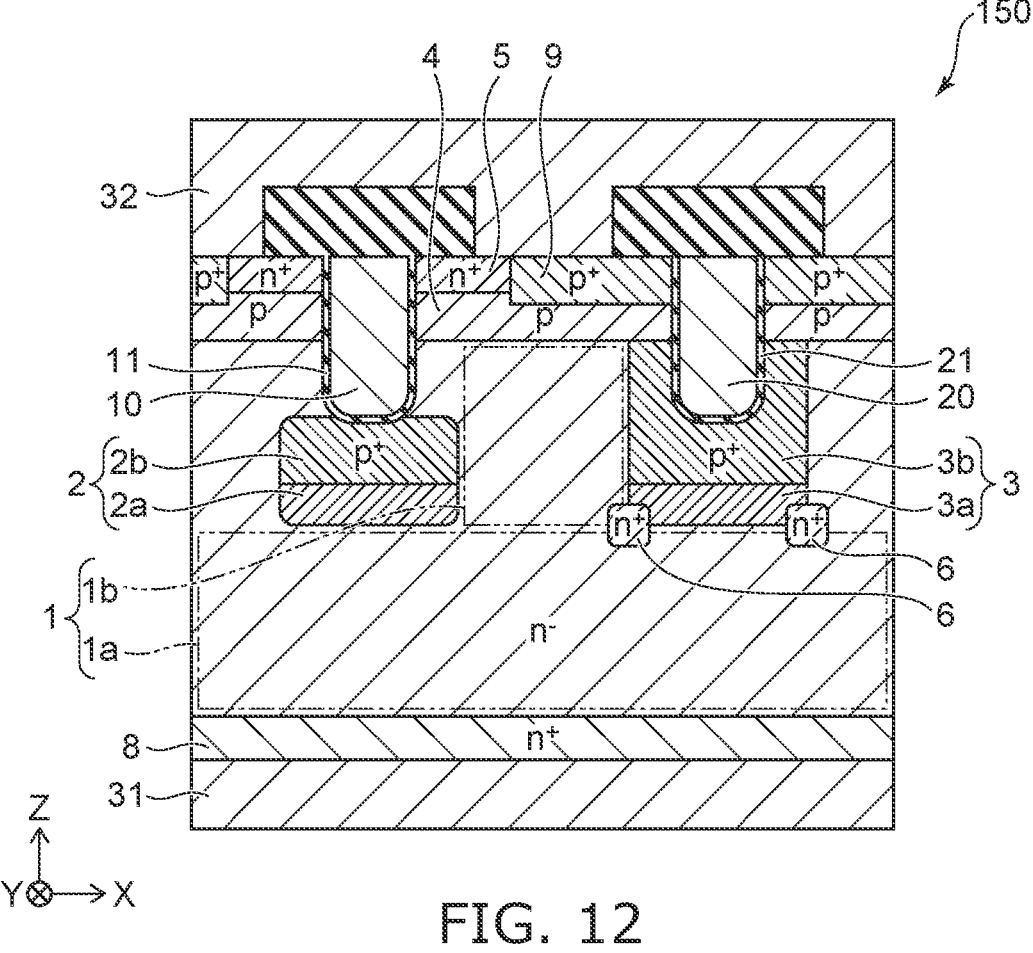
FIG. 12 is a schematic view showing a portion of a semiconductor device according to a fifth modification of the first embodiment.

FIG. 12 is a schematic view showing a portion of a semiconductor device according to a fifth modification of the first embodiment.

In the semiconductor device 150 according to the fifth modification as shown in FIG. 12, the p$^+$-type semiconductor region 3 includes a first portion 3*a* and a second portion 3*b*. The second portion 3*b* is located on the first portion 3*a*. The second portion 3*b* is positioned between the first portion 3*a* and the conductive part 20. The p-type impurity concentration of the first portion 3*a* is greater than the p-type impurity concentration of the second portion 3*b*.

Similarly, the p$^+$-type semiconductor region 2 includes a portion 2*a* and a portion 2*b*. The portion 2*b* is located on the portion 2*a*. The portion 2*b* is positioned between the portion 2*a* and the gate electrode 10. The p-type impurity concentration of the portion 2*a* is greater than the p-type impurity concentration of the portion 2*b*.

The electric field strength at the insulating layer 21 vicinity can be reduced by providing the first portion 3*a* of the p$^+$-type semiconductor region 3 at a position separated from the conductive part 20. The occurrence of dielectric breakdown of the insulating layer 21 can be suppressed thereby. Similarly, the electric field strength at the gate insulating layer 11 vicinity can be reduced by providing the portion 2*a* of the p$^+$-type semiconductor region 2 at a position separated from the gate electrode 10. The occurrence of dielectric breakdown of the gate insulating layer 11 can be suppressed thereby.

It is favorable for the n$^+$-type semiconductor region 6 to contact the first portion 3*a*. In the illustrated example, the n$^+$-type semiconductor regions 6 contact the lower ends of the X-direction end portions of the first portion 3*a*. By contacting the first portion 3*a,* the n$^+$-type semiconductor region 6 can further increase the electric field strength at the p-n junction vicinity between the p$^+$-type semiconductor region 3 and the n$^+$-type semiconductor region 6. As a result, avalanche breakdown occurs more easily between the p$^+$-type semiconductor region 3 and the n$^+$-type semiconductor region 6.

To suppress the diffusion of the p-type impurity while increasing the electric field strength, it is favorable for the p-type impurity concentration of the first portion 3*a* to be greater than $1.0 \times 10^{19}$ atoms/cm$^3$ and less than $1.0 \times 10^{20}$ atoms/cm$^3$. It is favorable for the p-type impurity concentration of the second portion 3*b* to be greater than $1.0 \times 10^{17}$ atoms/cm$^3$ and less than $1.0 \times 10^{18}$ atoms/cm$^3$.

Or, the p-type impurity concentration of the first portion 3*a* may be greater than $1.0 \times 10^{17}$ atoms/cm$^3$ and less than $1.0 \times 10^{18}$ atoms/cm$^3$; and the p-type impurity concentration of the second portion 3*b* may be greater than $1.0 \times 10^{18}$ atoms/cm$^3$ and less than $1.0 \times 10^{19}$ atoms/cm$^3$. The electric field strength at the p-n junction vicinity between the n$^-$-type drift region 1 and the first portion 3*a* can be reduced when the p-type impurity concentration of the first portion 3*a* is less than the p-type impurity concentration of the second portion 3*b*. The breakdown voltage of the semiconductor device 150 can be increased thereby.

Figures 13, 14:
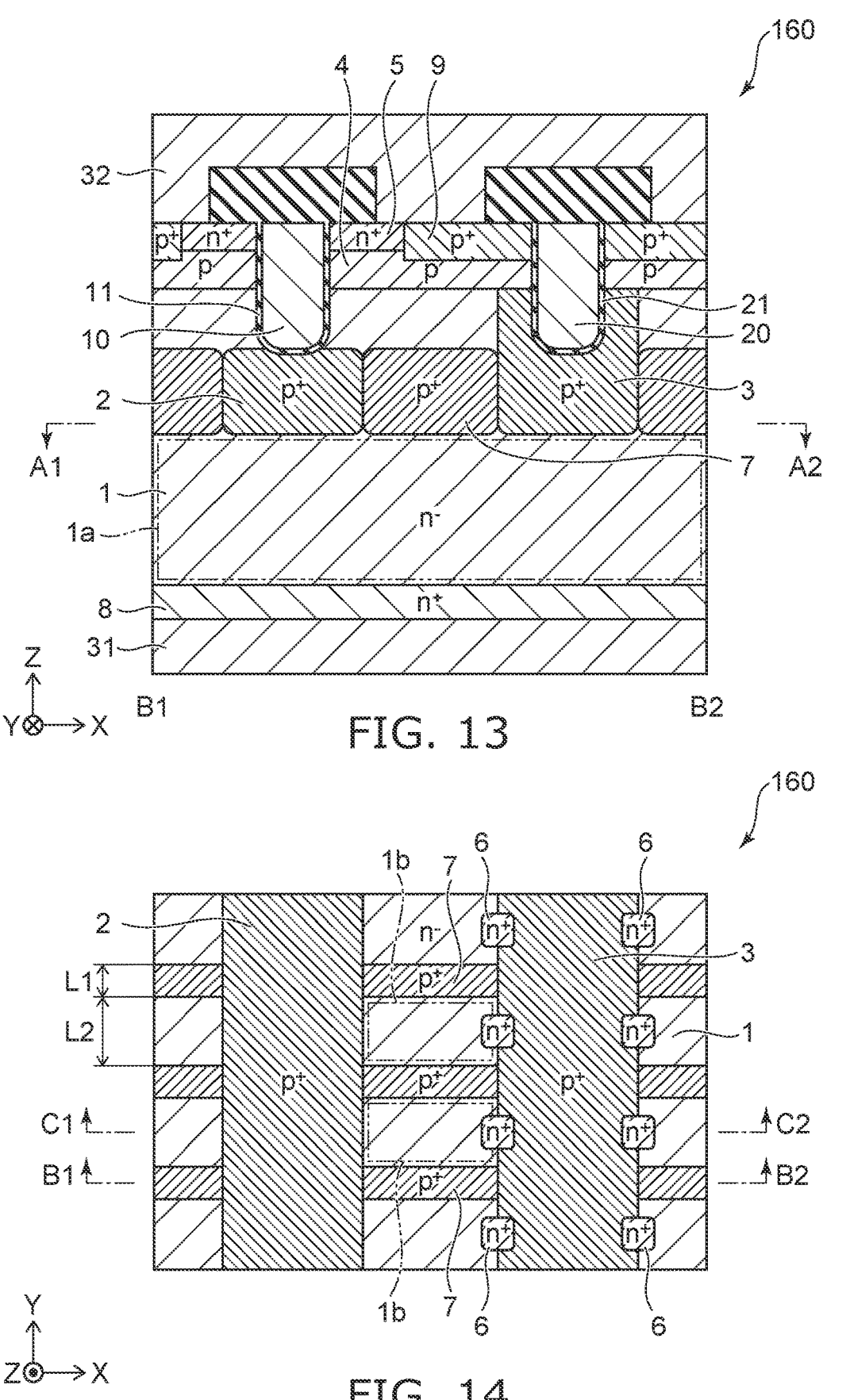
FIG. 13 is a cross-sectional view showing a portion of a semiconductor device according to a sixth modification of the first embodiment.
FIG. 14 is an A1-A2 cross-sectional view of FIG. 13.

FIG. 13 is a cross-sectional view showing a portion of a semiconductor device according to a sixth modification of the first embodiment. FIG. 14 is an A1-A2 cross-sectional view of FIG. 13. FIG. 13 corresponds to a B1-B2 cross-sectional view of FIG. 14.

The semiconductor device 160 according to the sixth modification further includes a $p^+$-type connection region 7 (a seventh semiconductor region). The $p^+$-type connection region 7 is positioned between the $p^+$-type semiconductor region 2 and the $p^+$-type semiconductor region 3 in the X-direction and contacts the $p^+$-type semiconductor region 2 and the $p^+$-type semiconductor region 3. The $p^+$-type semiconductor region 2 is electrically connected with the $p^+$-type semiconductor region 3 by the $p^+$-type connection region 7. Therefore, the potential of the $p^+$-type semiconductor region 2 is substantially equal to the potential of the $p^+$-type semiconductor region 3 and the potential of the p-type base region 4. The p-type impurity concentration of the $p^+$-type connection region 7 is equal to the p-type impurity concentrations of the $p^+$-type semiconductor region 2 and the $p^+$-type semiconductor region 3. Or, the p-type impurity concentration of the $p^+$-type connection region 7 may be different from the p-type impurity concentrations of the $p^+$-type semiconductor region 2 and the $p^+$-type semiconductor region 3.

As shown in FIG. 14, the $p^+$-type semiconductor region 2 and the $p^+$-type semiconductor region 3 extend in the Y-direction. The $p^+$t-type connection regions 7 are arranged with the second regions 1b in the Y-direction between the $p^+$-type semiconductor region 2 and the $p^+$-type semiconductor region 3. The second region 1b and the $p^+$-type connection region 7 are alternately arranged in the Y-direction. The multiple $n^+$-type semiconductor regions 6 are arranged with the multiple second regions 1b in the X-direction.

A length L1 in the Y-direction of the $p^+$-type connection region 7 is less than a length L2 in the Y-direction of the second region 1b. Thereby, the potential of the $p^+$-type semiconductor region 2 can be stabilized while suppressing the increase of the on-resistance of the semiconductor device 160.

The cross-sectional structure at line C1-C2 shown in FIG. 14 is similar to the cross-sectional structure shown in FIG. 1. Therefore, avalanche breakdown occurs easily between the $p^+$-type semiconductor region 3 and the $n^+$-type semiconductor region 6; and breakdown of the semiconductor device 160 can be suppressed. The holes can be efficiently discharged via the $p^+$-type connection region 7 and the $p^+$-type semiconductor region 3 even when avalanche breakdown occurs between the $n^-$-type drift region 1 and the $p^+$-type semiconductor region 2. Therefore, compared to the semiconductor device 100, breakdown of the semiconductor device 160 due to avalanche breakdown can be further suppressed.

Figure 15:
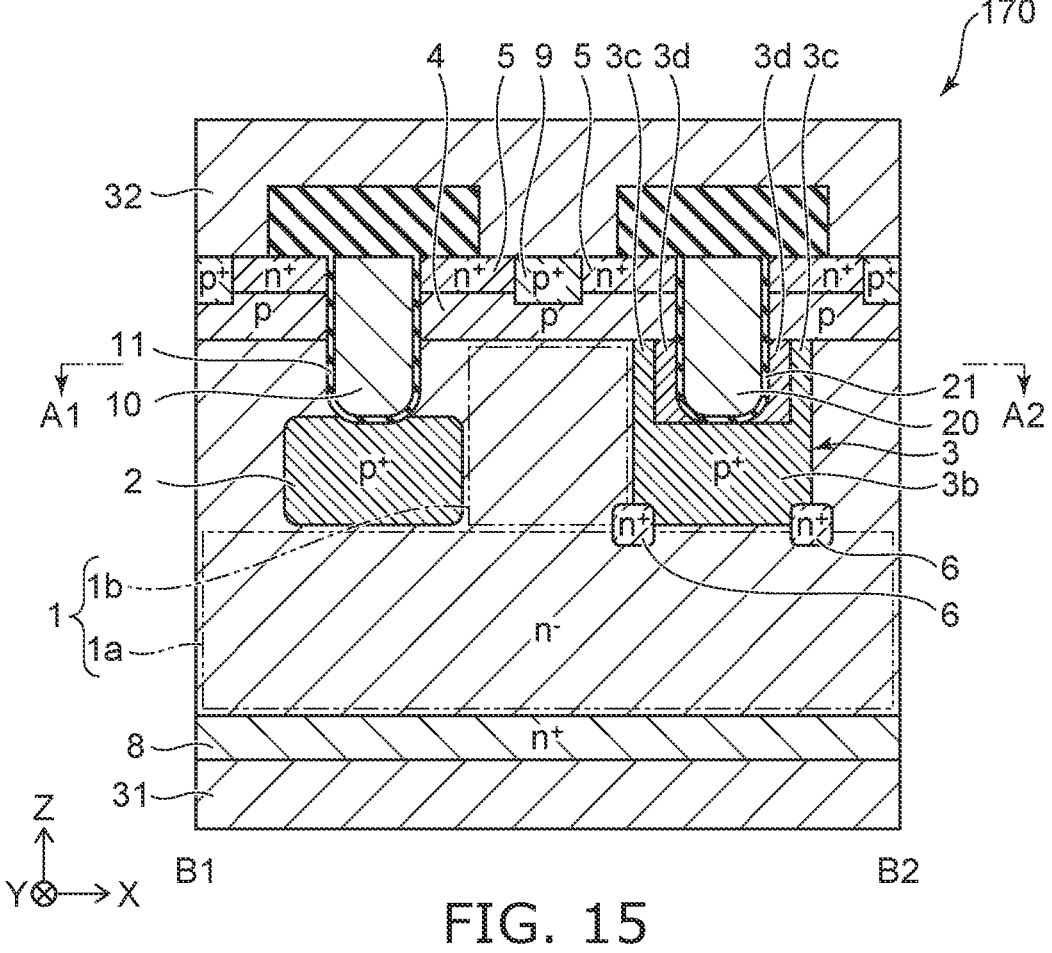
FIG. 15 is a cross-sectional view showing a portion of a semiconductor device according to a seventh modification of the first embodiment.
Figures 16, 17:
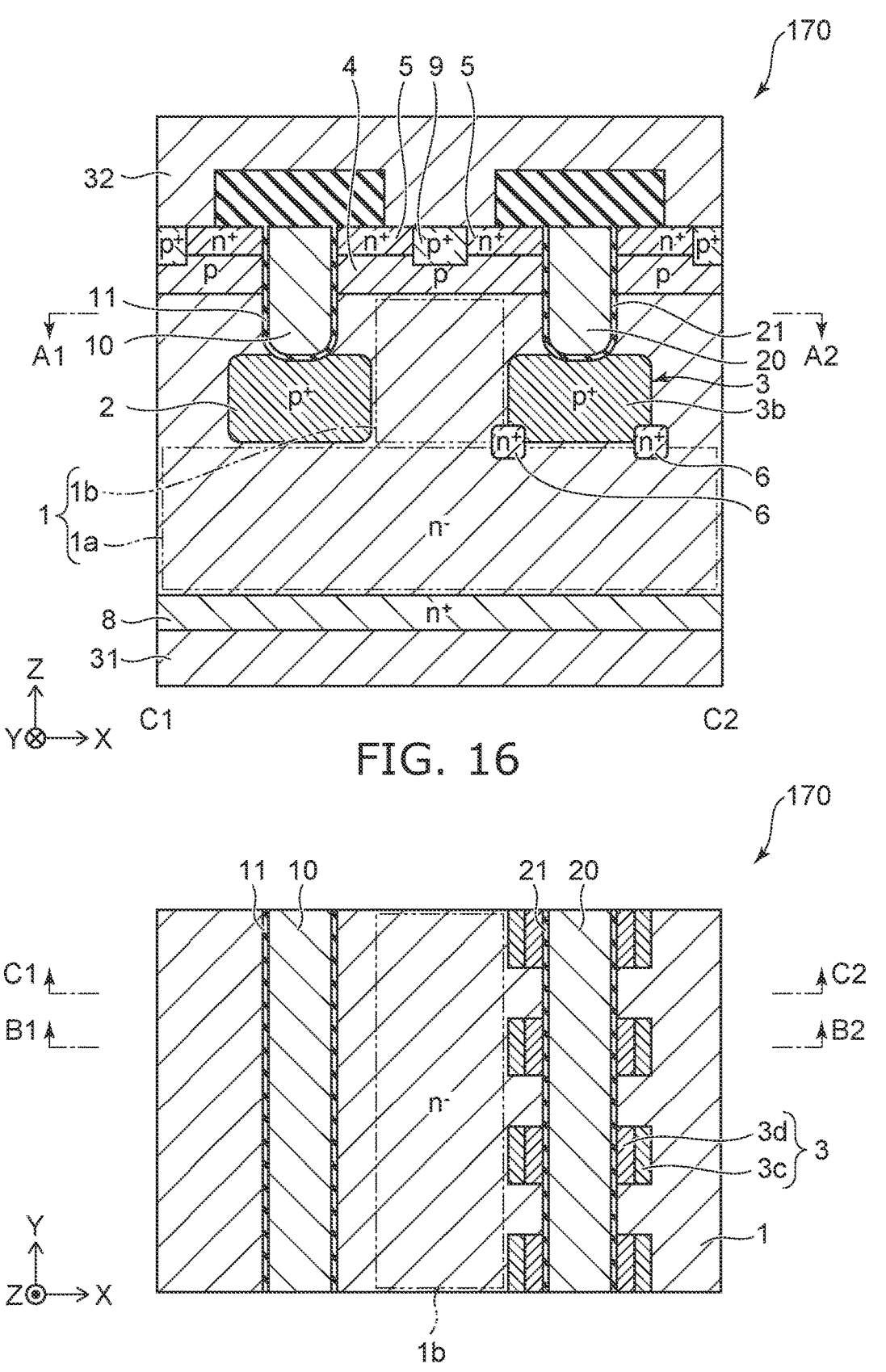
FIG. 16 is a cross-sectional view showing a portion of the semiconductor device according to the seventh modification of the first embodiment.
FIG. 17 is an A1-A2 cross-sectional view of FIGS. 15 and 16.

FIGS. 15 and 16 are cross-sectional views showing a portion of a semiconductor device according to a seventh modification of the first embodiment. FIG. 17 is an A1-A2 cross-sectional view of FIGS. 15 and 16. FIGS. 15 and 16 correspond to a B1-B2 cross-sectional view and a C1-C2 cross-sectional view of FIG. 17.

In the semiconductor device 170 according to the seventh modification as shown in FIG. 15, the $p^+$-type semiconductor region 3 includes the second to fourth portions 3b to 3d. The third portion 3c is located on a portion of the second portion 3b. The fourth portion 3d is located between the third portion 3c and the conductive part 20 in the X-direction. The third portion 3c and the fourth portion 3d contact the p-type base region 4. In the illustrated example, the conductive part 20 and a pair of fourth portion 3ds are positioned between a pair of third portion 3cs. The conductive part 20 is positioned between the pair of fourth portion 3ds.

The p-type impurity concentration of the fourth portion 3d is less than the p-type impurity concentrations of the second portion 3b and the third portion 3c. The difference between the p-type impurity concentration of the fourth portion 3d and the p-type impurity concentration of the p-type base region 4 is less than the difference between the p-type impurity concentration of the third portion 3c and the p-type impurity concentration of the p-type base region 4.

As shown in FIG. 16, the third portion 3c and the fourth portion 3d are not located in the X-Z cross section of a portion of the semiconductor device 170. In such cross sections, the conductive part 20 faces the $n^-$-type drift region 1 via the insulating layer 21 between the second portion 3b and the p-type base region 4.

As shown in FIG. 17, the multiple third portions 3c are separated from each other and arranged along the Y-direction. The multiple fourth portions 3d are positioned between the conductive part 20 and the multiple third portions 3c.

Figure 18:
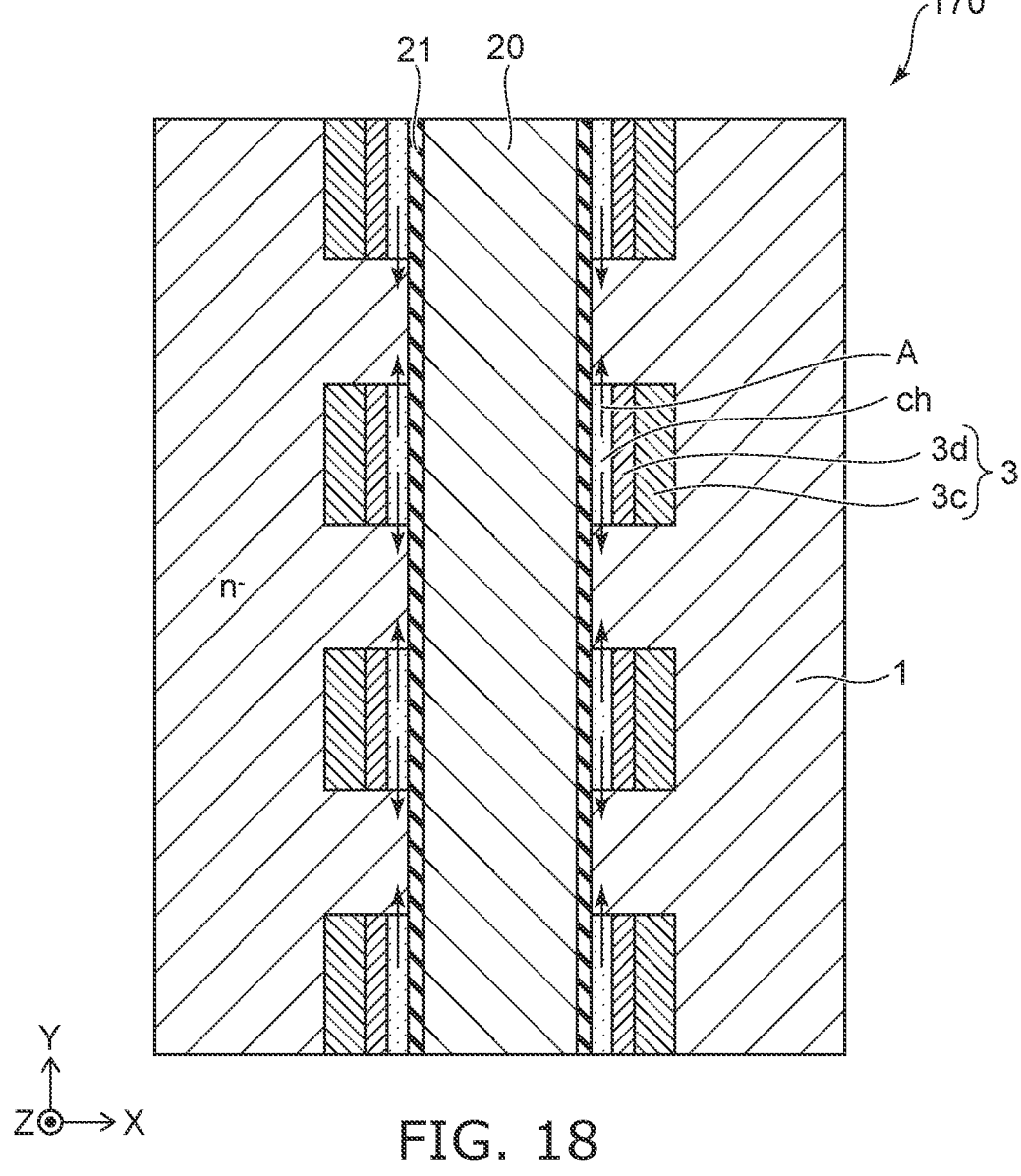
FIG. 18 is a schematic view showing an operation of the semiconductor device according to the seventh modification of the first embodiment.

FIG. 18 is a schematic view showing an operation of the semiconductor device according to the seventh modification of the first embodiment.

In the semiconductor device 170, the conductive part 20 is electrically connected with the gate electrode 10. When the semiconductor device 170 is in the on-state as shown in FIG. 18, a channel ch is formed in the fourth portion 3d as well as the p-type base region 4. As shown by arrows A, some of the electrons flow from the channel of the p-type base region 4 toward the $n^-$-type drift region 1 via the channel ch of the fourth portion 3d.

According to the seventh modification, when the semiconductor device 170 is in the on-state, current can flow not only at the periphery of the gate electrode 10 but also at the periphery of the conductive part 20. In particular, the current can flow through the channel formed in the fourth portion 3d of the $p^+$-type semiconductor region 3. Thereby, the on-resistance of the semiconductor device 170 can be reduced compared to the semiconductor device 100. Also, the second portion 3b is electrically connected with the p-type base region 4 by the third portion 3c that has a higher p-type impurity concentration than the fourth portion 3d. Therefore, by including the fourth portion 3d, the increase of the electrical resistance to holes between the $p^+$-type semiconductor region 3 and the p-type base region 4 can be suppressed.

Figure 19:
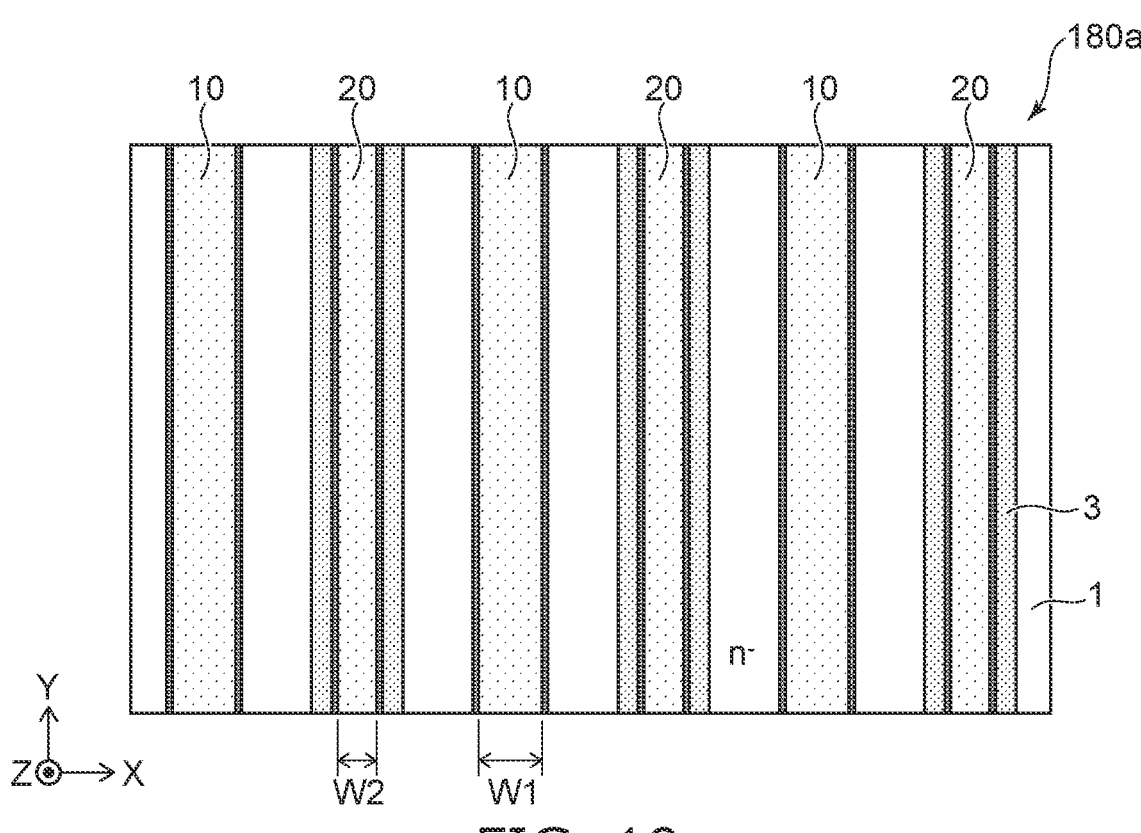
FIG. 19 is a plan view showing a portion of a semiconductor device according to an eighth modification of the first embodiment.
Figure 20:
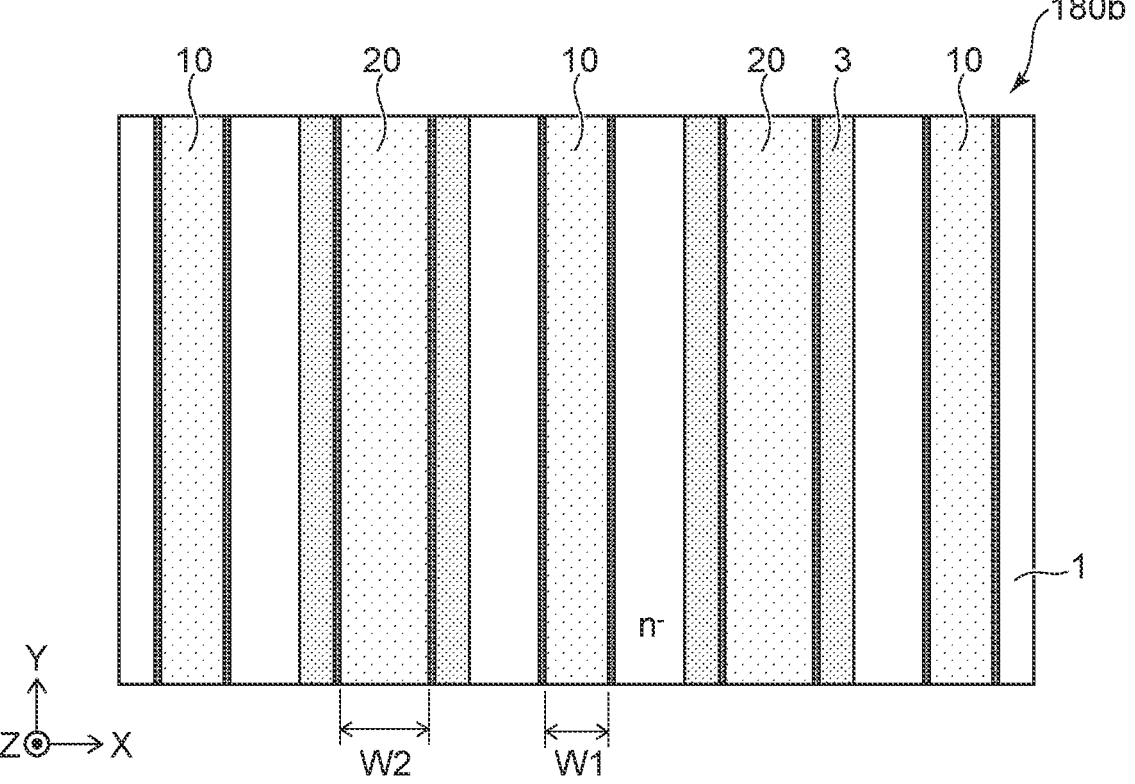
FIG. 20 is a plan view showing a portion of a semiconductor device according to an eighth modification of the first embodiment.

FIGS. 19 and 20 are plan views showing portions of semiconductor devices according to an eighth modification of the first embodiment.

In the semiconductor devices 180a and 180b according to the eighth modification as shown in FIGS. 19 and 20, a width W1 of the gate electrode 10 and a width W2 of the conductive part 20 are different from each other. The widths are the lengths in the X-direction.

In the semiconductor device 180a shown in FIG. 19, the width W2 is less than the width W1. The narrower width W1 allows the number of the gate electrodes 10 per unit area to be increased compared to when the width W1 and the width W2 are the same. Compared to the semiconductor device 100, the on-resistance of the semiconductor device 180a can be further reduced thereby.

In the semiconductor device 180b shown in FIG. 20, the width W2 is greater than the width W1. The width of the $p^+$-type semiconductor region 3 also increases as the width W2 increases. At the breakdown voltage of the semiconductor device 180b, electric field concentration occurs at the lower ends of the two X-direction side portions of the p⁺t-type semiconductor region 3. When the width of the p⁺-type semiconductor region 3 is narrow, the electric field distribution at one lower end periphery affects the electric field distribution at the other lower end periphery. The electric field strengths at the two lower ends increase together, and the electric field strength is excessively increased. The increase of the electric field strengths at both lower ends can be suppressed by increasing the width of the p⁺-type semiconductor region 3. As a result, the breakdown voltage of the semiconductor device 180b can be increased.

Second Embodiment

Figure 21:
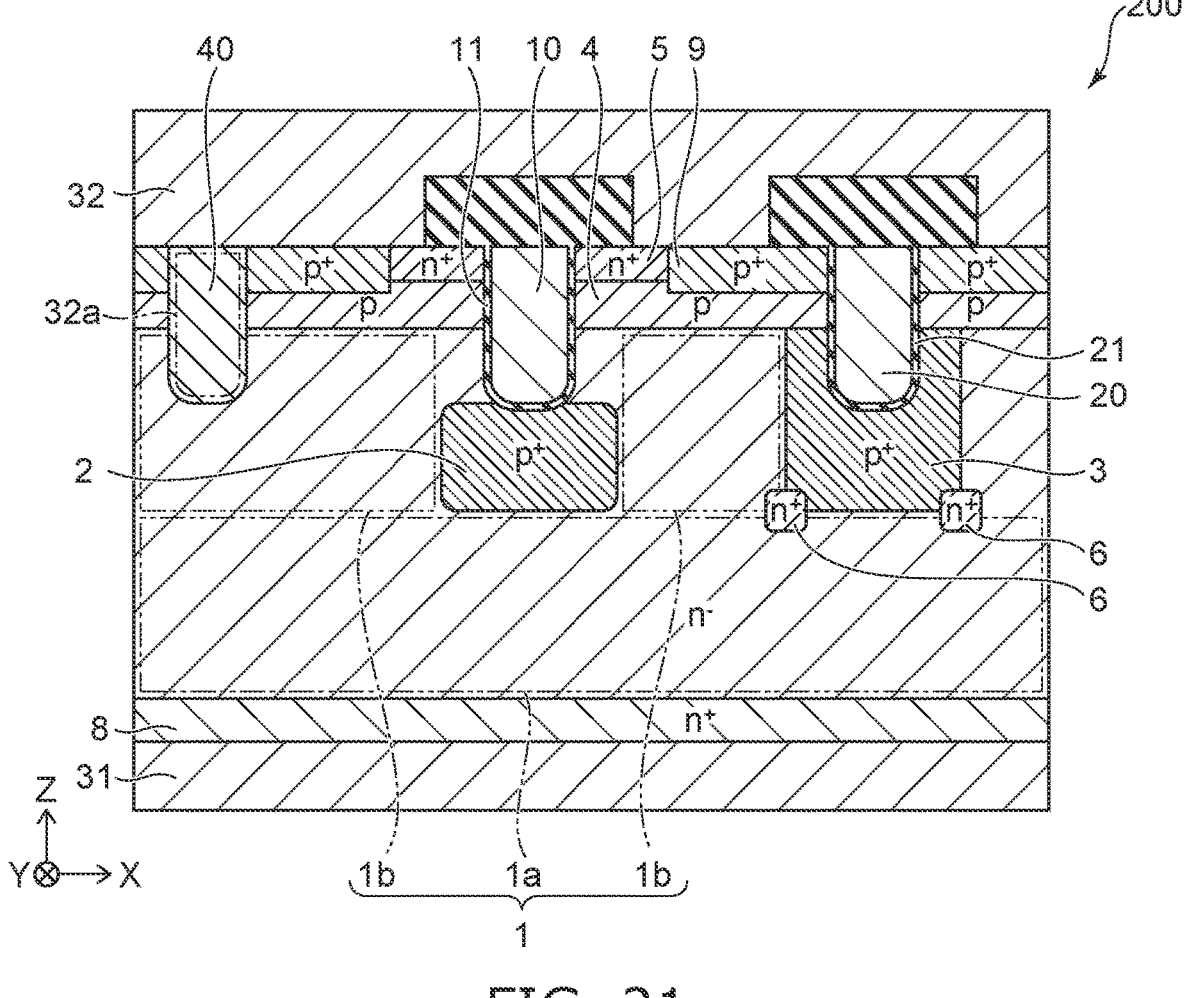
FIG. 21 is a cross-sectional view showing a portion of a semiconductor device according to a second embodiment.

FIG. 21 is a cross-sectional view showing a portion of a semiconductor device according to the second embodiment.

As shown in FIG. 21, compared to the semiconductor device 100 according to the first embodiment, the semiconductor device 200 according to the second embodiment further includes a Schottky barrier diode (SBD) 40. In the semiconductor device 200, the source electrode 32 includes a protrusion 32a that extends downward. The protrusion 32a is arranged with the p-type base region 4 and the p⁺-type contact region 9 in the X-direction and contacts these semiconductor regions. The lower portion of the protrusion 32a contacts the second region 1b of the n⁻-type drift region 1. The SBD 40 is formed of the second region 1b and the protrusion 32a.

The source electrode 32 includes titanium, platinum, vanadium, etc., to form the SBD 40. The source electrode 32 may include a stacked film of titanium and aluminum.

Other than the SBD 40, the semiconductor device 200 includes a P-N diode made of the n⁻-type drift region 1 and the p-type base region 4. The characteristics of the semiconductor device 200 change if a current flows in the P-N diode when a positive voltage with respect to the drain electrode 31 is applied to the source electrode 32. For example, crystal defects in the semiconductor regions increase, and the on-resistance of the semiconductor device 200 fluctuates.

The SBD 40 has a lower on-voltage than the P-N diode. Therefore, when a positive voltage with respect to the drain electrode 31 is applied to the source electrode 32 of the semiconductor device 200, a current flows in the SBD 40; and the current that flows in the P-N diode can be reduced. The increase of crystal defects can be suppressed, and the fluctuation of the on-resistance of the semiconductor device 200 can be suppressed. As a result, the reliability of the semiconductor device 200 can be increased.

Figure 22:
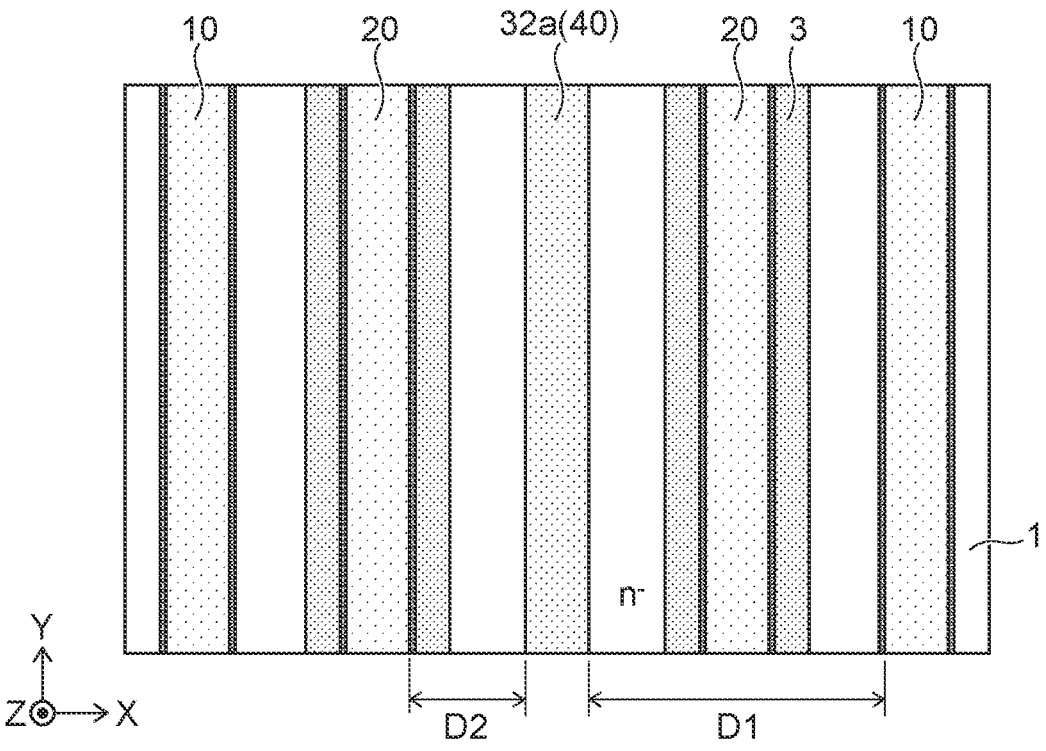
FIG. 22 is a plan view showing a portion of the semiconductor device according to the second embodiment.
Figure 23:
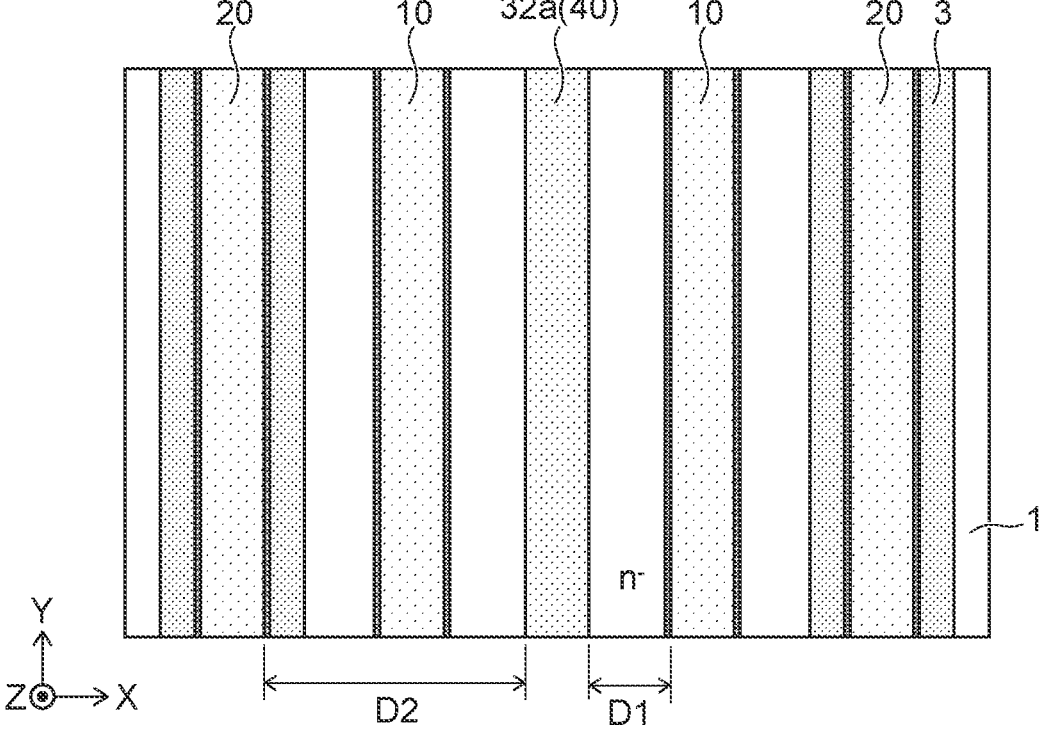
FIG. 23 is a plan view showing a portion of the semiconductor device according to the second embodiment.

FIGS. 22 and 23 are plan views showing portions of semiconductor devices according to the second embodiment.

For example, as shown in FIG. 22, the conductive part 20 is located between the gate electrode 10 and the SBD 40 in the X-direction. The SBD 40 is positioned between the conductive parts 20. According to this arrangement, compared to the structure shown in FIG. 23 described below, a distance D1 (a first distance) in the X-direction between the SBD 40 and the gate electrode 10 next to the SBD 40 in the X-direction can be increased. When the semiconductor device 200 is in the on-state, heat is generated by the current flowing at the gate electrode 10 vicinity. By increasing the distance D1, a temperature rise of the SBD 40 due to the heat generation can be suppressed. As a result, degradation of the Schottky electrode (the protrusion 32a) can be suppressed.

As shown in FIG. 23, the gate electrode 10 may be located between the conductive part 20 and the SBD 40 in the X-direction. The SBD 40 is positioned between the gate electrodes 10. According to this arrangement, compared to the structure shown in FIG. 22 described above, a distance D2 (a second distance) in the X-direction between the SBD 40 and the conductive part 20 next to the SBD 40 in the X-direction can be increased. When avalanche breakdown occurs in the semiconductor device 200, heat is generated by a current flowing at the conductive part 20 vicinity. The temperature rise of the SBD 40 due to the heat generation can be suppressed by increasing the distance D2. As a result, the degradation of the Schottky electrode (the protrusion 32a) can be suppressed.

Third Embodiment

Figure 24:
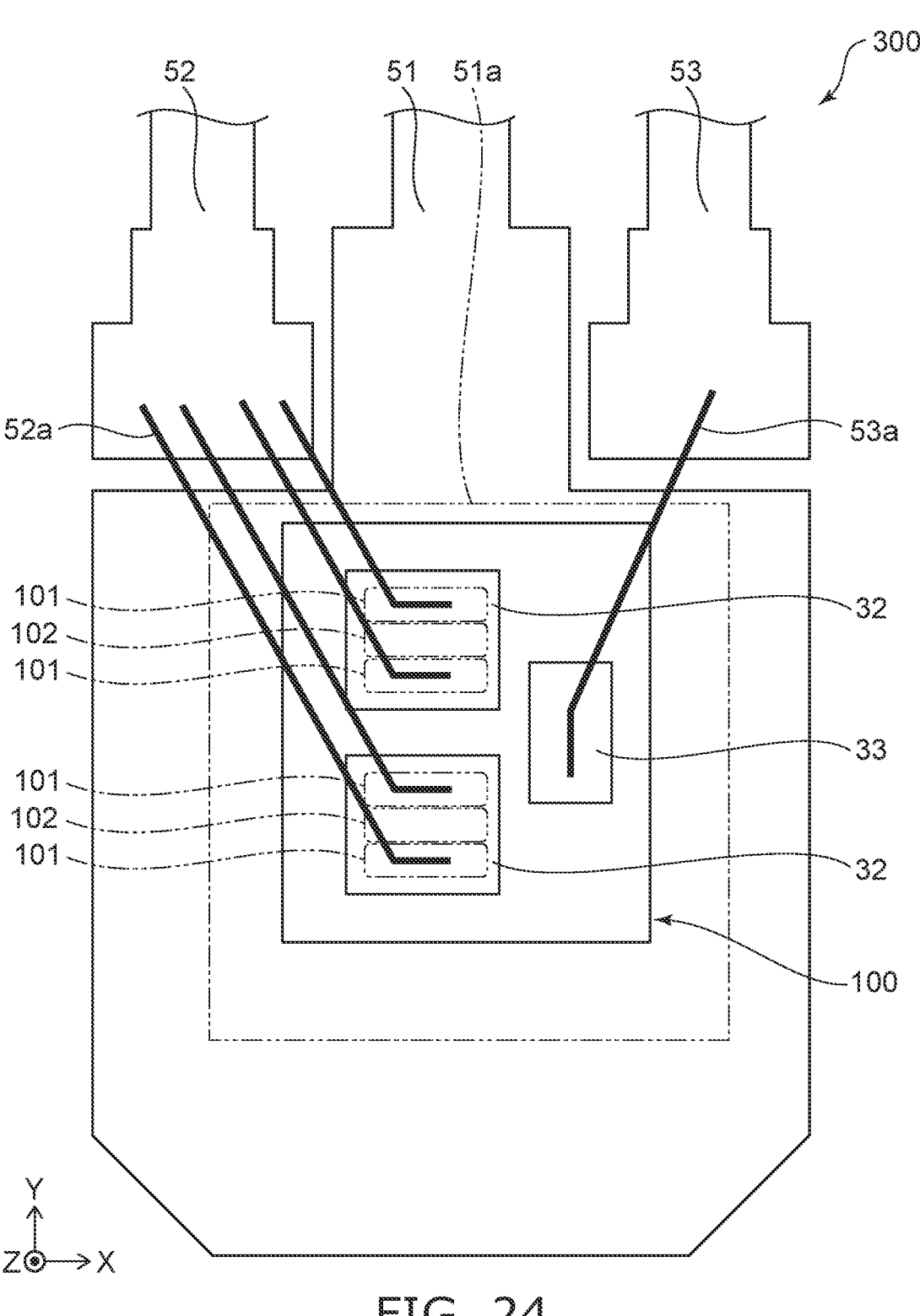
FIG. 24 is a plan view showing a portion of a semiconductor package according to a third embodiment.

FIG. 24 is a plan view showing a portion of a semiconductor package according to a third embodiment.

As shown in FIG. 24, the semiconductor package 300 according to the third embodiment includes the semiconductor device 100, a drain terminal 51 (a first terminal), a source terminal 52 (a second terminal), and a gate terminal 53 (a third terminal). The semiconductor device 100 includes the multiple source electrodes 32 and a gate pad 33.

The multiple source electrodes 32 are separated from each other at the upper surface of the semiconductor device 100. The gate pad 33 is separated from the multiple source electrodes 32. The gate pad 33 is electrically isolated from the multiple source electrodes 32 and electrically connected with the gate electrode 10. The gate pad 33 also may be electrically connected with the conductive part 20.

The drain terminal 51 includes a mounting portion 51a. The mounting portion 51a has a plate shape spreading along the X-Y plane. The drain electrode 31 of the semiconductor device 100 is mounted on the mounting portion 51a and electrically connected with the drain terminal 51. The source terminal 52 is electrically connected with the source electrode 32 by an interconnect 52a. The gate terminal 53 is electrically connected with the gate pad 33 by an interconnect 53a.

The drain terminal 51, the source terminal 52, and the gate terminal 53 include metals such as copper, iron, nickel, etc. The interconnects 52a and 53a are copper wires, aluminum ribbons, Al—Cu wires, Al—Cu ribbons, etc., and are formed by wire bonding. The interconnects 52a and 53a each may be a portion of a leadframe.

The semiconductor device 100 includes the first structure part 101 and the second structure part 102. In the first structure part 101 as shown in FIG. 7A, the number of the conductive parts 20 per unit area is greater than the number of the gate electrodes 10 per unit area. In the second structure part 102 as shown in FIG. 7B, the number of the gate electrodes 10 per unit area is greater than the number of the conductive parts 20 per unit area.

The interconnect 52a is positioned directly above the first structure part 101. In other words, one end of the interconnect 52a contacts the source electrode 32 directly above the first structure part 101. The number of the interconnects 52a positioned directly above the first structure part 101 is greater than the number of the interconnects 52a positioned directly above the second structure part 102. The electrical resistance between the interconnect 52a and the first structure part 101 can be lower when the interconnect 52a is positioned directly above the first structure part 101 than when the interconnect 52a is positioned directly above the second structure part 102.

Compared to the second structure part 102, avalanche breakdown easily occurs in the first structure part 101. When avalanche breakdown occurs, a large amount of electrons and holes is generated in the first structure part 101. Positioning the interconnect 52*a* directly above the first structure part 101 causes holes to easily flow toward the interconnect 52*a*. As a result, breakdown of the semiconductor device 100 due to avalanche breakdown can be suppressed, and the reliability of the semiconductor package 300 can be increased. Also, by including the second structure part 102 in the semiconductor device 100, the increase of the on-resistance due to the inclusion of the first structure part 101 can be suppressed.

The structures according to the embodiments and examples described above are combinable as appropriate. For example, the cross-sectional structures of the first structure part 101 and the second structure part 102 shown in FIGS. 7A and 7B may have structures similar to any of the semiconductor devices 110 to 170. Similarly to the semiconductor device 150, the p$^+$-type semiconductor region 3 may include the first portion 3*a* and the second portion 3*b* in any of the semiconductor devices 110 to 140. Similarly to the semiconductor device 160, the p$^+$-type connection region 7 may be included in any of the semiconductor devices 110 to 150. Similarly to the semiconductor device 170, the p$^+$-type semiconductor region 3 may include the second to fourth portions 3*b* to 3*d* in any of the semiconductor devices 110 to 160. Similarly to the semiconductor device 200, the SBD 40 may be included in any of the semiconductor devices 110 to 170, 180*a*, or 180*b*. The semiconductor devices 110 to 170, 180*a*, 180*b*, or 200 may be included in the semiconductor package 300 instead of the semiconductor device 100. In such a case, the semiconductor devices 110 to 170, 180*a*, 180*b*, or 200 include the first structure part 101 in which the number of the conductive parts 20 per unit area is greater than the number of the gate electrodes 10 per unit area.

In the embodiments described above, the relative levels of the impurity concentrations between the semiconductor regions can be confirmed using, for example, a scanning capacitance microscope (SCM). The carrier concentration in each semiconductor region can be considered to be equal to the activated impurity concentration in each semiconductor region. Accordingly, the relative levels of the carrier concentrations between the semiconductor regions also can be confirmed using SCM. The impurity concentration in each semiconductor region can be measured by secondary ion mass spectrometry (SIMS).

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention. The above embodiments can be practiced in combination with each other.

What is claimed is:

1. A semiconductor device, comprising:
a first electrode;
a first semiconductor region located on the first electrode and electrically connected with the first electrode, the first semiconductor region being of a first conductivity type, the first semiconductor region including
a first region, and
a second region located on the first region;

a second semiconductor region located on the first region, the second semiconductor region being of a second conductivity type;
a gate electrode located on the second semiconductor region with a gate insulating layer interposed;
a third semiconductor region located on the first region, the third semiconductor region being of the second conductivity type and being separated from the second semiconductor region with the second region interposed in a second direction, the second direction being perpendicular to a first direction, the first direction being from the first electrode toward the first semiconductor region;
a conductive part located on the third semiconductor region with an insulating layer interposed;
a fourth semiconductor region located on the second region, the fourth semiconductor region being of the second conductivity type and contacting the third semiconductor region;
a fifth semiconductor region located on a portion of the fourth semiconductor region, the fifth semiconductor region being of the first conductivity type;
a plurality of pairs of sixth semiconductor regions, each pair of sixth semiconductor regions being respectively provided at both ends of the third semiconductor region in the second direction, each of the sixth semiconductor regions of the plurality of pairs being of the first conductivity type and in direct contact with a lower end of the third semiconductor region, the plurality of pairs of sixth semiconductor regions being aligned in a third direction perpendicular to the first and second directions, a first-conductivity-type impurity concentration in the sixth semiconductor regions of the plurality of pairs being greater than a first-conductivity-type impurity concentration in the first semiconductor region; and
a second electrode located on the fourth and fifth semiconductor regions and electrically connected with the fourth and fifth semiconductor regions,
wherein the third semiconductor region is located between the fourth semiconductor region and the plurality of pairs of sixth semiconductor regions in the first direction.

2. The device according to claim 1, wherein
a first-conductivity-type impurity concentration in the second region is greater than the first-conductivity-type impurity concentration in the first region.

3. The device according to claim 1, wherein
the third semiconductor region includes a first portion, and a second portion located on the first portion,
a portion of the second portion is positioned between the first portion and the conductive part in the first direction, and
a second-conductivity-type impurity concentration of the first portion is greater than a second-conductivity-type impurity concentration of the second portion.

4. The device according to claim 1, further comprising:
a seventh semiconductor region located between the second semiconductor region and the third semiconductor region,
the seventh semiconductor region being of the second conductivity type,
the seventh semiconductor region being arranged with the second region in a third direction perpendicular to the first and second directions.

5. The device according to claim 1, wherein
the third semiconductor region includes:
a second portion;

a third portion located on a portion of the second portion; and a fourth portion located on an other portion of the second portion, the fourth portion is positioned between the conductive part and the third portion in the second direction, and a second-conductivity-type impurity concentration of the fourth portion is less than a second-conductivity-type impurity concentration of the third portion.

6. The device according to claim 5, wherein a plurality of the third portions and a plurality of the fourth portions each are arranged in a third direction perpendicular to the first and second directions.

7. The device according to claim 1, wherein a distance in the first direction between the first electrode and one of the sixth semiconductor regions of the plurality of pairs is less than a distance in the first direction between the first electrode and the second semiconductor region.

8. The device according to claim 1, wherein a distance in the first direction between the first electrode and one of the sixth semiconductor regions of the plurality of pairs is the same as a distance in the first direction between the first electrode and the second semiconductor region.

9. The device according to claim 1, wherein a distance in the first direction between the first electrode and one of the sixth semiconductor regions of the plurality of pairs is greater than a distance in the first direction between the first electrode and the second semiconductor region.

10. The device according to claim 1, wherein a length in the second direction of one of the sixth semiconductor regions of the plurality of pairs is less than a length in the second direction of the third semiconductor region.

11. The device according to claim 1, wherein a length in the second direction of one of the sixth semiconductor regions of the plurality of pairs is greater than a length in the second direction of the third semiconductor region.

12. A semiconductor package, comprising:

the device according to claim 1;

a first terminal electrically connected with the first electrode;

a second terminal electrically connected with the second electrode;

an interconnect electrically connecting the second electrode and the second terminal; and a third terminal electrically connected with the gate electrode, the device including a first structure part in which a number of the conductive parts per unit area is greater than a number of the gate electrodes per unit area, and the interconnect is positioned directly above the first structure part.

13. The package according to claim 12, wherein a plurality of the interconnects is included, the device further includes a second structure part in which the number of the gate electrodes per unit area is greater than the number of the conductive parts per unit area, and a number of the interconnects positioned directly above the first structure part is greater than a number of the interconnects positioned directly above the second structure part.

14. The semiconductor device according to claim 1, wherein a length of the third semiconductor region in the first direction is longer than a length of the second semiconductor region in the first direction.

15. The semiconductor device according to claim 1, wherein a distance between the third semiconductor region and a fourth semiconductor region in the first direction is shorter than a distance between the second semiconductor region and the fourth semiconductor region in the first direction.

16. A semiconductor device, comprising:

a first electrode;

a first semiconductor region located on the first electrode and electrically connected with the first electrode, the first semiconductor region being of a first conductivity type, the first semiconductor region including a first region, and a second region located on the first region;

a second semiconductor region located on the first region, the second semiconductor region being of a second conductivity type;

a gate electrode located on the second semiconductor region with a gate insulating layer interposed;

a third semiconductor region located on the first region, the third semiconductor region being of the second conductivity type and being separated from the second semiconductor region with the second region interposed in a second direction, the second direction being perpendicular to a first direction, the first direction being from the first electrode toward the first semiconductor region;

a conductive part located on the third semiconductor region with an insulating layer interposed;

a fourth semiconductor region located on the second region, the fourth semiconductor region being of the second conductivity type and contacting the third semiconductor region;

a fifth semiconductor region located on a portion of the fourth semiconductor region, the fifth semiconductor region being of the first conductivity type;

a plurality of pairs of sixth semiconductor regions, each pair of sixth semiconductor regions being respectively provided at both ends of the third semiconductor region in the second direction, each of the sixth semiconductor regions of the plurality of pairs being of the first conductivity type and in direct contact with a lower end of the third semiconductor region, the plurality of pairs of sixth semiconductor regions being aligned in a third direction perpendicular to the first and second directions, a first-conductivity-type impurity concentration in the sixth semiconductor regions of the plurality of pairs being greater than a first-conductivity-type impurity concentration in the first semiconductor region; and a second electrode located on the fourth and fifth semiconductor regions and electrically connected with the fourth and fifth semiconductor regions, wherein a length of the third semiconductor region in the first direction is longer than a length of the second semiconductor region in the first direction.

17. A semiconductor device, comprising:

a first electrode;

a first semiconductor region located on the first electrode and electrically connected with the first electrode, the first semiconductor region being of a first conductivity type, the first semiconductor region including a first region, and a second region located on the first region;

a second semiconductor region located on the first region, the second semiconductor region being of a second conductivity type;

a gate electrode located on the second semiconductor region with a gate insulating layer interposed;

a third semiconductor region located on the first region, the third semiconductor region being of the second conductivity type and being separated from the second semiconductor region with the second region interposed in a second direction, the second direction being perpendicular to a first direction, the first direction being from the first electrode toward the first semiconductor region;

a conductive part located on the third semiconductor region with an insulating layer interposed;

a fourth semiconductor region located on the second region, the fourth semiconductor region being of the second conductivity type and contacting the third semiconductor region;

a fifth semiconductor region located on a portion of the fourth semiconductor region, the fifth semiconductor region being of the first conductivity type;

a plurality of pairs of sixth semiconductor regions, each pair of the sixth semiconductor regions being respectively provided at both ends of the third semiconductor region in the second direction, each of the sixth semiconductor regions of the plurality of pairs being of the first conductivity type and in direct contact with a lower end of the third semiconductor region, the plurality of pairs of sixth semiconductor regions being aligned in a third direction perpendicular to the first and second directions, a first-conductivity-type impurity concentration in the sixth semiconductor regions of the plurality of pairs being greater than a first-conductivity-type impurity concentration in the first semiconductor region; and a second electrode located on the fourth and fifth semiconductor regions and electrically connected with the fourth and fifth semiconductor regions, wherein a distance between the third semiconductor region and a fourth semiconductor region in the first direction is shorter than a distance between the second semiconductor region and the fourth semiconductor region in the first direction.

\* \* \* \* \*